(12) United States Patent
Ouderkirk et al.

(10) Patent No.: US 11,340,386 B1
(45) Date of Patent: May 24, 2022

(54) INDEX-GRADIENT STRUCTURES WITH NANOVOIDED MATERIALS AND CORRESPONDING SYSTEMS AND METHODS

(71) Applicant: Facebook Technologies, LLC, Menlo Park, CA (US)

(72) Inventors: Andrew John Ouderkirk, Redmond, WA (US); Katherine Marie Smyth, Seattle, WA (US); Qi Zhang, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 207 days.

(21) Appl. No.: 16/213,902

(22) Filed: Dec. 7, 2018

(51) Int. Cl.
| | | |
|---|---|---|
| *G02B 1/111* | (2015.01) | |
| *C23C 16/46* | (2006.01) | |
| *C23C 18/14* | (2006.01) | |
| *C23C 16/48* | (2006.01) | |

(52) U.S. Cl.
CPC ............ *G02B 1/111* (2013.01); *C23C 16/463* (2013.01); *C23C 16/48* (2013.01); *C23C 18/14* (2013.01)

(58) Field of Classification Search
CPC .... G02B 1/11–118; G02B 27/01–0186; G02B 1/111; C23C 16/463
USPC ........................................................ 359/601
See application file for complete search history.

(56) References Cited

U.S. PATENT DOCUMENTS

| | | |
|---|---|---|
| 5,337,191 A | 8/1994 | Austin |
| 6,166,855 A | 12/2000 | Ikeyama et al. |
| 7,839,550 B1 | 11/2010 | Billmers et al. |
| 9,720,141 B1* | 8/2017 | Cheng ...................... G02B 1/18 |
| 2002/0186928 A1 | 12/2002 | Curtis |
| 2002/0191268 A1 | 12/2002 | Seeser et al. |
| 2004/0036932 A1 | 2/2004 | Korzinin et al. |
| 2007/0020404 A1* | 1/2007 | Seiberle ................... G02B 1/11 428/1.2 |
| 2007/0202273 A1 | 8/2007 | Hirai et al. |

(Continued)

OTHER PUBLICATIONS

U.S. Appl. No. 16/197,400, filed Nov. 21, 2018.

(Continued)

*Primary Examiner* — Kristina M Deherrera
(74) *Attorney, Agent, or Firm* — FisherBroyles, LLP

(57) ABSTRACT

Embodiments of the disclosure are directed to index-gradient antireflective coatings that include a differential concentration of nanovoids versus thickness of the coating. In one embodiment, an index-gradient antireflective coating may have an index of refraction that varies from a first value to that of a second material. In another embodiment, the substrate may be optically transparent, and made of, for example, polymer, glass, or ceramics. The index-gradient antireflective coating can be fabricated using a non-uniform spin-coating process, by successive thermal evaporation, or by a chemical vapor deposition (CVD) process. In another embodiment, the spin-coating process can include multiple steps that include different concentrations of monomers to solvent, different spin-speeds, or different annealing times/temperatures. Similarly, the thermal evaporation can include multiple steps that include different concentrations of monomers, initiators, solvents, and associated processing parameters. Various other methods, systems, apparatuses, and materials are also disclosed.

19 Claims, 7 Drawing Sheets

(56) References Cited

U.S. PATENT DOCUMENTS

| | | | |
|---|---|---|---|
| 2009/0268299 A1* | 10/2009 | Furui | G02B 5/0278 |
| | | | 359/601 |
| 2010/0002190 A1 | 1/2010 | Clarke et al. | |
| 2010/0314704 A1 | 12/2010 | Matsugai | |
| 2013/0215513 A1* | 8/2013 | Liang | C23C 18/122 |
| | | | 359/601 |
| 2014/0080040 A1 | 3/2014 | Fontecchio et al. | |
| 2015/0192728 A1 | 7/2015 | Thompson et al. | |
| 2015/0301667 A1 | 10/2015 | Yano et al. | |
| 2015/0346416 A1 | 12/2015 | Wolk et al. | |
| 2017/0192595 A1 | 7/2017 | Choi et al. | |
| 2017/0362502 A1 | 12/2017 | Lee et al. | |
| 2018/0093456 A1 | 4/2018 | Van Overmeere et al. | |
| 2019/0310394 A1 | 10/2019 | Miyamoto et al. | |

OTHER PUBLICATIONS

Non-Final Office Action received for U.S. Appl. No. 16/197,400 dated Apr. 8, 2020, 20 pages.
Final Office Action received for U.S. Appl. No. 16/197,400 dated Sep. 16, 2020, 20 pages.
Preinterview First Office Action received for U.S. Appl. No. 16/170,002 dated Jul. 31, 2020, 18 pages.
Mullin et al., "Pattern Transformation Triggered by Deformation", Physical Review Letters, vol. 99, No. 8, 2007, 4 pages.
Babaee et al., "3D Soft Metamaterials with Negative Poisson's ratio", Advanced Materials, vol. 25, No. 36, 2013, 18 pages.
Bertoldi et al., "Novel negative Poisson's ratio behavior induced by an elastic instability", Advanced Materials, vol. 22, No. 3, 2010, pp. 1-11.
Overvelde et al., "Relating pore shape to the non-linear response of periodic elastomeric structures", Journal of the Mechanics and Physics of Solids, vol. 64, 2014, 16 pages.
Shen et al., "Simple cubic three-dimensional auxetic metamaterials", Physic. Status Solidi (B), vol. 251, No. 8, 2014, pp. 1515-1522.
Correa et al., "Negative Stiffness Honeycombs for Recoverable Shock Isolation", Rapid Prototyping Journal, vol. 21, No. 2, 2015, pp. 702-713.
Coulais et al., "Discontinuous Buckling of Wide Beams and Metabeams", Physical Review Letters, vol. 115, 2015, 7 pages.
Bickel et al., "Design and Fabrication of Materials with Desired Deformation Behavior", ACM Transactions on Graphics (TOG), vol. 29, No. 4, Jul. 2010, 10 pages.
Rosset et al., "Small, fast, and tough: Shrinking down integrated elastomer transducers", Applied Physics Reviews, vol. 3, No. 3, 2016, pp. 1-27.
Plante et al., "Large-scale failure modes of dielectric elastomer actuators", International Journal of Solids and Structures, vol. 43, 2006, pp. 7727-7751.
"Optotune DEAPs", Electroactive polymers, URL: https://www.optotune.com/technology/electroactive-polymers, 2019, 3 pages.
Product—Novasentis, "EMP Haptic Actuators For Sensory Innovation", URL: https://www.novasentis.com/product, 2019, 4 pages.
Rosset et al., "Mechanical characterization of a dielectric elastomer microactuator with ion-implanted electrodes", Sensor and Actuators A 144, 2008, 25 pages.
Gerratt et al., "Dielectric breakdown of PDMS thin films", Journal of Micromechanics and Microengineering, vol. 23, Apr. 26, 2013, 8 pages.
Hunt et al., "A self-healing dielectric elastomer actuator", Applied Physics Letters, vol. 104, 2014, 4 pages.
Skov et al., "Optimization Techniques for Improving the Performance of Silicone-Based Dielectric Elastomers", Advanced Engineering Materials, vol. 20, 2018, pp. 1-21.
Mazurek et al., "Glycerol as high-permittivity liquid filler in dielectric silicone elastomers", Journal of Applied Polymer Science, vol. 133, No. 43, 2016, 28 pages.
Rao et al., "Synthesis of flexible silica aerogels using methyltrimethoxysilane (MTMS) precursor", Journal of Colloid and Interface Science, vol. 300, 2006, pp. 279-285.
Seo et al., "Reticulated Nanoporous Polymers by Controlled Polymerization-Induced Microphase Separation", Science, vol. 336, Jun. 15, 2012, 5 pages.
Jennings, S.G., "The mean free path in air", Journal of Aerosol Science, vol. 19, No. 2, 1988, pp. 1-2.
Gupta et al., "Nanoemulsions: formation, properties and applications", Soft Matter, 2016, 16 pages.
Helgeson et al., "Mesoporous organohydrogels from thermogelling photocrosslinkable nanoemulsions", Nature Materials, vol. 11, Apr. 2012, pp. 344-352.
Guha et al., "Creating nanoscale emulsions using condensation", Nature Communications, vol. 8, No. 1371, Nov. 8, 2017, pp. 1-7.
Meier et al., "Microemulsion elastomers", Colloid Polymer Science, vol. 274, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.
Crawford, Gregory P., "Electrically Switchable Bragg Gratings", Optics & Photonics News, Apr. 30, 2003, pp. 54-59.
International Search Report and Written Opinion received for PCT Application Serial No. PCT/IB2019/056844 dated Mar. 13, 2020, 15 pages.
Kim et al., "Enhanced oxygen detection using porous polymeric gratings with integrated recognition elements", ScienceDirect, Sensors and Actuators B, vol. 130, No. 2, Nov. 17, 2007, pp. 758-764.
Kim et al., "Tunable Porous Photonic Bandgap Structures for Chemical and Biological Sensing", Proceedings of the SPIE, vol. 6322, Article: 632201, Aug. 30, 2006, pp. 1-10.
Notice of Allowance received for U.S. Appl. No. 16/197,400 dated Mar. 24, 2021, 25 pages.
Non-Final Office Action received for U.S. Appl. No. 16/170,002 dated Dec. 8, 2020, 51 pages.
Notice of Allowance received for U.S. Appl. No. 16/170,002 dated Feb. 9, 2021, 43 pages.
Non-Final Office Action received for U.S. Appl. No. 16/170,002 dated May 28, 2021, 49 pages.
Preinterview First Office Action received for U.S. Appl. No. 16/213,906 dated Dec. 22, 2020, 25 pages.
Final Office Action received for U.S. Appl. No. 16/213,906 dated May 17, 2021, 22 pages.

* cited by examiner

INDEX-GRADIENT STRUCTURES WITH NANOVOIDED MATERIALS AND CORRESPONDING SYSTEMS AND METHODS

BACKGROUND

Augmented reality (AR) and virtual reality (VR) eyewear devices or headsets may enable users to experience events, such as interacting with people in a computer-generated simulation of a three-dimensional world or viewing data superimposed on a real-world view. AR/VR eyewear devices and headsets may also be used for purposes other than recreation. For example, governments may use such devices for military training simulations, doctors may use such devices to practice surgery, and engineers may use such devices them as visualization aids.

AR/VR eyewear devices and headsets typically include some form of optical system or device, such as an optical lens assembly configured to focus or direct light from the device's display and/or the real world to the user's eyes. Thus, there is a need for improving such optical systems.

SUMMARY

As will be described in greater detail below, the instant disclosure describes index-gradient structures with nanovoided materials, and associated systems and methods. In one embodiment, an anti-reflective structure is described. The anti-reflective structure may include a material defining a plurality of nanovoids, the material including a first region having a first refractive index corresponding to a first concentration of nanovoids per unit volume, and a second region having a second refractive index corresponding to a second concentration of nanovoids per unit volume. Moreover, the first region and the second region may be overlapped in a thickness direction of the anti-reflective structure.

In another embodiment, the first region has a first refractive index of approximately 1.15 and the second region has a second refractive index greater than approximately 1.3. In one embodiment, the anti-reflective structure includes at least one of a polymer or an oxide. In another embodiment, the anti-reflective structure has an optical thickness of about one half of a central wavelength of a spectral region for which a reflectance is to be reduced.

In one embodiment, the anti-reflective structure may be fabricated using a non-uniform spin-coating process. In another embodiment, the non-uniform spin-coating process includes dispensing a fluid onto a surface of a substrate at a first radial position while spinning the substrate at a first angular velocity, and dispensing the fluid onto the surface of the substrate at a second radial position while spinning the substrate at a second angular velocity. In another embodiment, the non-uniform spin-coating process includes dispensing a first fluid having a first concentration of monomers onto a surface of a substrate, and dispensing a second fluid having a second concentration of monomers onto the first fluid.

In one embodiment, the non-uniform spin-coating process includes dispensing a first fluid onto a surface of a substrate, processing the dispensed fluid at a first temperature for a first duration to generate the first region, dispensing a second fluid onto the first region, and processing the second fluid at a second temperature for a second duration to generate the second region.

In one embodiment, the non-uniform spin-coating process includes dispensing a first fluid including a first ratio of monomer to solvent onto a surface of a substrate, processing the first fluid with actinic light to generate the first region, dispensing a second fluid containing a second ratio of monomer to solvent, and processing the second fluid with actinic light to generate a second region.

In one embodiment, the anti-reflective coating may be fabricated using a thermal evaporation process. In another embodiment, the thermal evaporation process includes depositing a first vapor onto a surface of a substrate to generate the first region, the first vapor including a first concentration of a monomer, and depositing a second vapor onto the first region to generate the second region, the second vapor including a second concentration of the monomer, where the first concentration and the second concentration are different.

In one embodiment, the thermal evaporation process includes depositing a vapor onto a surface of a substrate to generate the first region, processing the first region at a first temperature for a first duration, depositing the vapor onto the first region to generate a second region, and processing the second region at a second temperature for a second duration.

In another embodiment, the thermal evaporation process may include depositing a first vapor including a solvent and a monomer onto a surface of a substrate to generate the first region, the first vapor having a first ratio of the solvent to the monomer; and depositing a second vapor including a solvent and a monomer onto a surface of a substrate to generate the first region, the first vapor having a second ratio of the solvent to the monomer, where the first ratio and the second ratio are different ratios.

In one embodiment, the anti-reflective structure may be fabricated using initiated chemical vapor deposition (iCVD), where the vapor includes a monomer and a solvent. In another embodiment, the ratio of the monomer and the solvent changes during the deposition process. In at least one example, the material defining the plurality of nanovoids may include a closed-cell nanovoided material.

In one embodiment, an optical system is described, the optical system including an optical element, and an anti-reflective structure disposed at least partially on a surface of the optical element, the anti-reflective structure including a material defining a plurality of nanovoids. In one embodiment, the material may include a first region having a first refractive index corresponding to a first concentration of nanovoids per unit volume, and a second region having a second refractive index corresponding to a second concentration of nanovoids per unit volume, the first region and the second region being overlapped in a thickness direction of the anti-reflective structure.

In another embodiment, the optical system includes at least one of an augmented reality functionality, a virtual reality functionality, or a mixed reality functionality. In one embodiment, the first region has a first refractive index of approximately 1.0 and the second region has a second refractive index greater than approximately 1.0. In one embodiment, the anti-reflective structure includes at least one of a polymer or an oxide. In another embodiment, the anti-reflective structure has an optical thickness of about one half of a central wavelength of a spectral region for which a reflectance is to be reduced.

In one embodiment, a method of fabricating an anti-reflective structure including a material defining a plurality of nanovoids, the method including depositing a first fluid on a substrate, processing the first fluid to form a first region having a first refractive index corresponding to a first concentration of nanovoids per unit volume, depositing a second fluid on the first region, and processing the second fluid to form a second region having a second refractive index corresponding to a second concentration of nanovoids per unit volume. In another embodiment, the first region has a first refractive index of approximately 1.0 and the second region has a second refractive index greater than approximately 1.0.

In one embodiment, the anti-reflective structure may be fabricated using a non-uniform spin-coating process in which depositing the first fluid and processing the first fluid include dispensing the first fluid onto a surface of the substrate at a first radial position while spinning the substrate at a first angular velocity, and depositing the second fluid and processing the second fluid include dispensing the second fluid onto the substrate's surface at a second radial position while spinning the substrate at a second angular velocity.

In another embodiment, the anti-reflective structure may be fabricated using a thermal evaporation process in which depositing the first fluid includes depositing a first vapor onto a surface of the substrate to generate the first region, the first vapor including a first concentration of a monomer, and depositing the second fluid includes depositing a second vapor onto the first region to generate the second region, the second vapor including a second concentration of the monomer, where the first concentration and the second concentration are different.

While the exemplary embodiments described herein are susceptible to various modifications and alternative forms, specific embodiments will be described in detail herein. However, the exemplary embodiments described herein are not intended to be limited to the particular forms disclosed. Rather, the instant disclosure covers all modifications, equivalents, and alternatives falling within this disclosure.

Features from any of the embodiments of the present disclosure may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
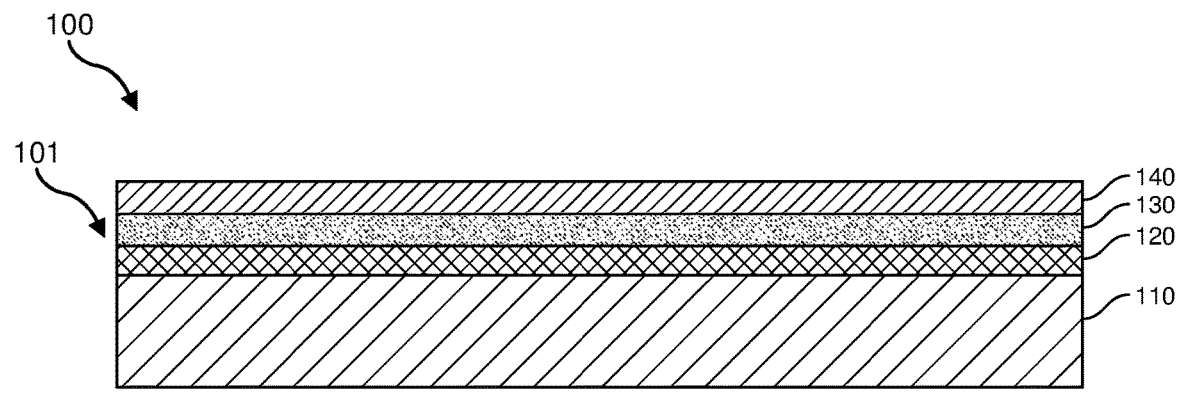
FIG. 1 shows a diagram of an example index gradient structure including an antireflective (AR) coating, in accordance with example embodiments of the disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

As will be explained in greater detail below, embodiments of the instant disclosure are generally directed to index gradient structure, and methods and systems for manufacturing or forming such an index gradient structure.

In various embodiments, the index gradient structure may include an antireflective coating that includes a differential concentration of nanovoids versus thickness of the coating. In one embodiment, an index gradient structure including an antireflective coating may have an index of refraction that varies from a first value (e.g., approximately that of air, 1) to that of a constituent substrate (e.g., approximately 1.2-2). In another embodiment, the substrate may be optically transparent, and made of, for example, polymer, glass, or ceramics.

The index-gradient antireflective coating can be fabricated using a non-uniform spin-coating process, by successive thermal evaporation, or by a chemical vapor deposition (CVD) process, such as initiated CVD (iCVD). In another embodiment, the spin-coating process can, for example, include multiple steps that include different concentrations of monomers to solvent, different spin-speeds, or different annealing times/temperatures. Similarly, the thermal evaporation can include multiple steps that include different concentrations of monomers, initiators, solvents, and associated processing parameters (e.g., anneal temperatures and times).

In various embodiments, the index gradient structure including an antireflective coating can be used in connection with any optical components, such as lenses, mirrors, polarizers, and the like. In another embodiment, the index-gradient structure may be referred to herein as an index gradient antireflective coating. Further such an index gradient antireflective coating may be used in connection with head-mounted displays (HMDs), for example, to reduce angular glare that may result from the user moving their head with respect to a source of ambient light.

In another embodiment, the index-gradient antireflective coatings may include a nanovoided material having a three-dimensional structure as opposed to a two-dimensional structure, for example, an extruded two-dimensional structure. Examples of extruded two-dimensional structures includes motheye low index layers and columnar structures formed by any suitable technique, for example, patterned sputter etching. Three-dimensional structures, on the other hand, may have a number of advantages over two-dimensional structures, including the ability to have additional coatings applied to the surface, for example coatings that are thermally evaporated and other deposited coatings. The three-dimensional structures may be either open-cell or closed-cell, or a combination thereof. In another embodiment, the three-dimensional structure may be formed by applying a coating onto a two-dimensional structure in a manner such that the pores formed by the two-dimensional structure are not completely filled. Furthermore, the index gradient structure may include nanovoided material that may be made from polymer such as from silicone (including those based on polydimethyl siloxanes), acrylates (including polymethyl methacrylate, ethyl acrylate, butyl acrylate, di, tri, and poly functional acrylates for crosslinkers), styrenes, urethanes, imides, olefins, homopolymer, copolymers, block copolymers, and combinations thereof.

While the index gradient structure and materials of the present disclosure is described in connection with an HMD, the index gradient structure and nanovoided materials may be used in other fields. For example, the index gradient structure and nanovoided materials may be used in optical, electro-optical or electronic devices or components thereof. For example, they may be used as, a part of, or in combination with optical retardation films, polarizers, compensators, beam splitters, reflective films, alignment layers, color filters, antistatic protection sheets, or electromagnetic interference protection sheets, polarization-controlled lenses for autostereoscopic three-dimensional displays, and infrared reflection films, and the like.

The following will provide, with reference to FIGS. 1-10, detailed descriptions of systems, methods, and apparatuses for optical systems implementing index gradient structure and materials. The discussion associated with FIG. 1 includes a description of an index gradient structure that may be used with various embodiments. The discussion associated with FIG. 2 includes a description of another index gradient structure that may additionally or alternatively be used with various embodiments. The discussion around FIGS. 3 and 4 includes a description of the formation of nanovoids in a material (e.g., a polymer) that may be used in an index gradient structure, in accordance with example embodiments of the disclosure. The discussion relating to the embodiments depicted in FIGS. 5-7 describes various fabrication methods for the index gradient structure, in accordance with example embodiments of the disclosure. The discussion relating to the embodiments depicted in FIG. 8 describes a method of using the index gradient structure, in accordance with example embodiments of the disclosure. The discussion associated with FIG. 9 includes a flow chart for making the index gradient structure, in accordance with example embodiments of the disclosure. The discussion relating to the embodiment depicted in FIG. 10 includes a description of an example near-eye-display having lenses that may be actuated with the electroactive devices. While many of the examples discussed herein may be directed to head-worn display systems, embodiments of the instant disclosure may be implemented in a variety of different types of devices and systems.

FIG. 1 shows a diagram of an example index gradient structure in accordance with example embodiments of the disclosure. In another embodiment, the diagram 100 includes an index gradient structure 101 that may be an antireflective (AR) coating in accordance with at least one embodiment. In some examples, the index gradient structure 101 may include an optical component 110 and one or more nanovoided materials, to be discussed. In another embodiment, the optical component 110 may include any suitable optical component, including, but not limited to, a lens, a grating (e.g., a Bragg grating), a reflector, a mirror, a polarizer, a display surface, and the like.

In some examples, the optical component 110 may include any suitable materials, such as glass and/or plastic. The optical component 110 may be, for example, a lens that may include a crown glass material, such as a borosilicate crown glass material. In another embodiment, the crown glass may include additives such as zinc oxide, phosphorus pentoxide, barium oxide, and/or fluorite and lanthanum oxide, which may alter the optical or mechanical properties of the lenses. In another example, the lens may include a plastic material. For example, the lens may include a CR-39 lens material, due to its low specific gravity and low dispersion. In another example, the lens may include a polymer, such as a urethane-based polymer. In one embodiment, the lens may include a UV-blocking material, such as polycarbonate. Furthermore, the lens may include a high-refractive-index plastic, such as thiourethanes, in which sulfur content in the polymer may tune the index-of-refraction of the plastic.

In one embodiment, the optical component 110 may include a substrate. The substrate may include transparent materials such as sapphire or glass. In one embodiment, the substrate may include silicon, silicon oxide, silicon dioxide, aluminum oxide, an alloy of silicon and germanium, and/or indium phosphide (InP), and the like. In some embodiments, the substrate may include a semiconductor material (e.g., monocrystalline silicon, germanium, silicon germanium, SiGe, and/or a III-V based material (e.g., gallium arsenide), or any combination thereof. In various embodiments, the substrate may include a polymer-based substrate, glass, or any other bendable substrate including two-dimensional materials (e.g., graphene and molybdenum disulfide), organic materials (e.g., pentacene), transparent oxides (e.g., indium gallium zinc oxide, IGZO), polycrystalline III-V materials, polycrystalline germanium, polycrystalline silicon, amorphous III-V materials, amorphous germanium, amorphous silicon, or any combination thereof.

In one embodiment, the optical component 110 may include a surface of an electrode (e.g., a transparent conductor, not shown), that may be in contact with the index gradient structure 101. In various embodiments, the electrode may be configured in any suitable manner. For example, in some embodiments, the electrode may be formed from a thin film of electrically conductive and semi-transparent material, such as indium tin oxide (ITO). In some implementations, alternatives to ITO may be used, including transparent conductive oxides (TCOs) (e.g., wider-spectrum TCOs), conductive polymers, metal grids, carbon nanotubes (CNT), graphene, nanowire meshes, and thin-metal films. Additional TCOs may include doped binary compounds, such as aluminum-doped zinc-oxide (AZO) and indium-doped cadmium-oxide. Moreover, TCOs may include barium stannate and metal oxides, such as strontium vanadate and calcium vanadate. In some implementations, conductive polymers may be used. For example, a poly(3,4-ethylenedioxythiophene) poly(styrene sulfonate) (PEDOT:PSS) layer may be used. In another example, a poly(4,4-dioctyl cyclopentadithiophene) material doped with iodine or 2,3-dichloro-5,6-dicyano-1,4-benzoquinone (DDQ) may be used. The example polymers and similar materials may be spin-coated in some example embodiments.

Further, the electrode may include any suitable material such as electrically conductive materials suitable for use in thin-film electrodes, such as, for example, aluminum, silver, indium, gallium, zinc, carbon black, and/or any other suitable materials formed by vacuum deposition, spray, adhesion, and/or any other suitable technique. In some embodiments, the electrode may be self-healing, such that damage from local shorting of a circuit may be isolated. Suitable self-healing electrodes may include thin films of metals, such as aluminum. In some configurations, it may be necessary for the electrode to stretch elastically. In such embodiments, the electrode may include TCOs, graphene, carbon nanotubes, and the like.

In some embodiments, a pair of electrodes from an additional optical component (not shown) may apply a voltage to at least portions of the index gradient structure 101, which may result in a change to the internal pressure of gases in the nanovoided regions of one or more nanovoided materials. For example, gases may diffuse either into or out of the nanovoided materials during dimensional changes associated with a deformation the index gradient structure 101 resulting from the application of the voltage. Accordingly, in an embodiment, the nanovoids may be filled with a gas to suppress electrical breakdown of the nanovoided materials (for example, during deformation). In another embodiment, the gases may include sulfur hexafluoride, fluorocarbon gases (e.g., 3M NOVEC 4710 insulating gas, available from 3M Company, Maplewood, Minn., USA), or any other suitable gas. In another embodiment, the index gradient structure 101 may have a sealing layer (not shown) applied to the edges of the index gradient structure 101, or to one or more of the electrodes, or a combination thereof. Suitable sealing layers may include thin film layers of an inorganic material, such as silica, applied with any suitable method, such as, for example, atomic layer deposition (ALD), physical vapor deposition (PVD), chemical vapor deposition (CVD), or the like. Sealing of the edges of the index gradient structure 101 may be done after the nanovoided materials are filled with gas. Suitable methods for filling the nanovoided materials may include removing the solvent, either under vacuum, within a supercritical fluid such as supercritical $CO_2$, or by aging the material in a desired gas, such as air, sulfur hexafluoride or fluorocarbons. Vents may be incorporated into the thin film coatings during the deposition process, such as by adding a shadow mask, or vents may be added later by etching, decomposing, or ablating an array of holes, lines, or other shapes into the optical structure after or during deposition. The thin film layers may also be made from one or more dyads of a polymer layer and an inorganic layer. In an embodiment, the sealing layer may also include a barrier material such as polychlorotrifluoroethylene (PCTFE) or other polymer applied by solvent or with initiated-CVD.

In one embodiment, while diagram 101 illustrates a single optical component 110, there may be another optical element (not shown), which may contact a surface of the third nanovoided material 140 (or any additional nanovoided materials, if included in the index gradient structure 101). In some examples, the optical component 110 (or a second optical element, not shown) may be connected to the index gradient structure 101 using any suitable material (e.g., an index-matching material). In some embodiments, an index-matching material may refer to a substance, such as a liquid, cement (adhesive), or gel that has an index of refraction that closely approximates that of another object (e.g., a lens). By using an index-matching material between the optical component 110 including a lens and the index gradient structure 101, radiation may pass from one lens to the other lens without significant reflection or refraction. In some examples, polymers dissolved in volatile organic compounds (VOCs), such as polyurethanes, polyesters, polystyrenes, polycarbonates and acrylic compounds dissolved in compatible solvents and/or a mixture of several solvents (for example, containing butyl acetate and xylene or toluene), may be used as an index-matching layer. In one embodiment, the refractive index of the index matching layer may be between the refractive index of the optical component 110 and the refractive index of the index gradient structure 101.

In one embodiment, the first nanovoided material 120, the second nanovoided material 130, and/or the third nanovoided material 140 may form an index gradient AR structure, that is, an AR structure that has a gradient in the overall refractive index of the coating. Accordingly, such an index gradient structure may include a refractive index whose change follows a function of the coordinates of a region of interest in the AR structure (e.g., z-axis dependent, where the z-axis is defined as being perpendicular to the surface of the AR structure). In one embodiment, the AR structure may include a first nanovoided material 120 that may have a first concentration of nanovoids. Moreover, the second nanovoided material 130 may have a second concentration of nanovoids. In one embodiment, the second concentration of nanovoids may be less than the first concentration of nanovoids. Further, the third nanovoided material 140 having a third concentration of nanovoids. In one embodiment, the third concentration of nanovoids may be less than the second concentration of nanovoids. As noted, there may be additional nanovoided materials (not shown), which can each have a progressively decreasing concentration of nanovoids. Alternatively, depending on the application, the concentration of nanovoids may increase from a given nanovoided material to the next (e.g., the concentration nanovoids may increase in the second nanovoided material 130 as compared with the first nanovoided material 120, and so on for the total number of nanovoided materials in the index gradient structure).

In some embodiments, the nanovoided materials (e.g., first nanovoided material 120, the second nanovoided material 130, the third nanovoided material 140, and/or any additional nanovoided material, not shown) may include electroactive polymers and/or elastomer materials. As used herein, "electroactive polymers" may refer to polymers that exhibit a change in size or shape when stimulated by an electric field. In some examples, an "electroactive polymer" may refer to a deformable polymer that may be symmetric with regard to electrical charge (e.g., polydimethylsiloxane (PDMS) acrylates, and the like) or asymmetric (e.g., poled polyvinylidene fluoride (PVDF) or its copolymers such as poly[(vinylidenefluoride-co-trifluoroethylene] (PVDF: TrFE)).

Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, for example, a dielectric constant ranging from approximately 2 to approximately 30.

In some embodiments, an "elastomer material" may refer to a polymer with viscoelasticity (i.e., both viscosity and elasticity) and relatively weak intermolecular forces, and generally low elastic modulus (a measure of the stiffness of a solid material) and high failure strain compared with other materials. In some embodiments, the nonaided materials (e.g., first nanovoided material 120, the second nanovoided material 130, the third nanovoided material 140, and/or any additional nanovoided material, not shown) may include an elastomer material that has an effective Poisson ratio of less than a predetermined value (e.g., less than approximately 0.35, less than approximately 0.3, less than approximately 0.2, or less than approximately 0.1). In at least one example, the elastomer material may have an effective density that is less than a predetermined value (e.g., less than approximately 90%, less than approximately 80%, less than approximately 60%, or less than approximately 40%) of the elastomer when densified (e.g., when the elastomer is compressed, for example, by electrodes to make the elastomer denser). As noted, in some examples, the nanovoided materials (e.g., first nanovoided material 120, the second nanovoided material 130, the third nanovoided material 130, and/or any additional nanovoided material, not shown) may, as the name implies, be nanovoided (e.g., having a plurality of nano-sized voids in the material). In some embodiments, the nanovoids may be at least approximately 10% (alternatively, at least approximately 30%, at least approximately 50%, or at least approximately 70%) of the volume of the nanovoided materials.

In some examples, the term "effective density" may refer to a parameter that may be obtained using a test method where a uniformly thick layer of a nanovoided material (e.g., elastomer) may be placed between two flat and rigid circular plates. In some embodiments, the diameter of the nanovoided material being compressed may be at least 100 times the thickness of the nanovoided material. The diameter of the nanovoided material may be measured, then the plates may be pressed together to exert a pressure of at least approximately $1 \times 10^6$ Pa on the nanovoided material, and the diameter of the nanovoided material may be remeasured. The effective density may be determined from the following expression: D_ratio=D_uncompressed/D_compressed, where D_ratio may represent the effective density ratio, D_uncompressed may represent the density of the uncompressed nanovoided material, and D_compressed may represent the density of the uncompressed nanovoided material.

As noted, optical component 110 may include transparent conductors (not shown), which may serve as electrodes. Further, some of the nanovoided materials (e.g., first nanovoided material 120, the second nanovoided material 130, the third nanovoided material 149, and/or any additional nanovoided material, not shown) may include a polymer material having nanovoids (e.g., a nanovoided polymer) that may be disposed between the transparent conductors. In some embodiments, the nanovoided polymer material may include particles of a material with a high dielectric constant (e.g., barium titanate). The particles may have an average diameter of between approximately 10 and approximately 1000 nm (e.g., between approximately 10 and approximately 100 nm, between approximately 20 and approximately 100 nm, and the like).

In some embodiments, some of the nanovoided materials (e.g., first nanovoided material 120, the second nanovoided material 130, the third nanovoided material 140, and/or any additional nanovoided material, not shown) may include nanovoided polymer materials that may include thermoplastic polymers. Suitable polymers may include, but are not limited to, polyolefins, for example, polyethylene homopolymers and copolymers, polypropylene, polypropylene homopolymers and copolymers, functionalized polyolefins, polyesters, poly(ester-ether), polyamides, including nylons, poly(ether-amide), polyether sulfones, fluoropolymers, polyurethanes, and mixtures thereof. Polyethylene homopolymers include those of low, medium or high density and/or those formed by high-pressure or low-pressure polymerization. Polyethylene and polypropylene copolymers include, but are not limited to, copolymers with C4-C8 alpha-olefin monomers, including 1-octene, 1-butene, 1-hexene, and 4-methyl pentene.

Other non-limiting examples of suitable olefinic polymeric compositions for use as the nanovoided polymer materials include olefinic block copolymers, olefinic random copolymers, polyurethanes, rubbers, vinyl arylenes, and conjugated diener, polyesters, polyamides, polyethers, polyisoprenes, polyneoprenes, copolymers of any of the above, and mixtures thereof.

Examples of suitable copolymers for use as the nanovoided polymer materials include, but are not limited to, copolymers such as poly(ethylene-butene), poly(ethylene-hexene), poly(ethylene-octene), and poly(ethylene-propylene), poly(ethylene-vinylacetate), poly(ethylene-methylacrylate), poly(ethylene-acrylic acid), poly(ethylene-butylacrylate), poly(ethylene-propylenediene), poly(methyl methacrylate) and/or polyolefin terpolymers thereof.

In some aspects, the nanovoided polymer materials may include elastomeric polymers, including styrenic block copolymers, elastomeric olefinic block copolymers and combinations thereof. Non-limiting examples of suitable styrenic block copolymers (SBC's) include styrene-butadiene-styrene (SBS), styrene-isoprene-styrene (SIS), styrene-ethylene-butylene-styrene (SEBS), styrene-ethylene-propylene (SEP), styrene-ethylene-propylene-styrene (SEPS), or styrene-ethylene-ethylene-propylene-styrene (SEEPS) block copolymer elastomers, polystyrene, and mixtures thereof. In one embodiment, the film may include styrene-butadiene-styrene, polystyrene, and mixtures thereof.

The nanovoided polymer materials may further include optional components, such as fillers, plasticizers, compatibilizers, draw down polymers, processing aids, anti-blocking agents, viscosity-reducing polymers, and the like. Other additives may include pigments, dyes, antioxidants, antistatic agents, slip agents, foaming agents, heat or light stabilizers, UV stabilizers, and the like.

In some embodiments, the nanovoided materials (e.g., first nanovoided material 120, the second nanovoided material 130, the third nanovoided material 130, and/or any additional nanovoided material, not shown) may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 µm, approximately 9 µm, approximately 10 µm), with an example thickness of approximately 200 nm to approximately 500 nm.

As noted, in some embodiments, the nanovoided materials (e.g., the first nanovoided material 120, the second nanovoided material 130, the third nanovoided material 140, and/or any additional nanovoided material, not shown) may include particles of a material having a high dielectric constant, the particles having an average diameter between approximately 10 nm and approximately 1000 nm. In some embodiments, the material having the high dielectric constant may include barium titanate BaTiO₃), which is a member of the perovskite family and which may also include other titanates. Additionally or alternatively, any other suitable component may be added to the electroactive polymer material. BaTiO₃ is a ferroelectric material with a relatively high dielectric constant (e.g., a value of between approximately 500 and approximately 7000) and polarization and may be used in various embodiments described herein. Besides large polarizability and permittivity, large strains may also be achievable with BaTiO₃. Pure BaTiO₃ may be an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the nanovoided materials.

Figure 2:
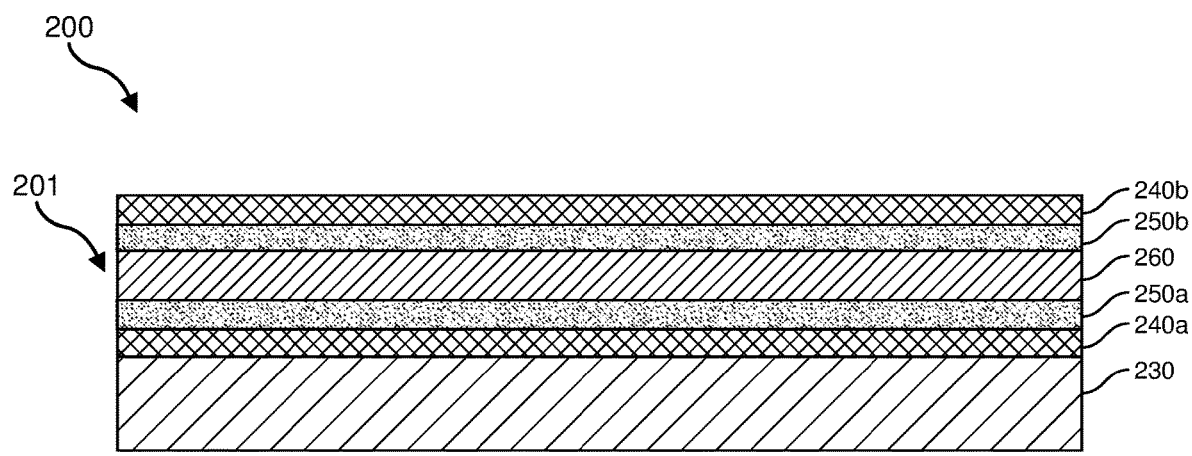
FIG. 2 shows a diagram of an example symmetric multilayer index gradient structure, in accordance with example embodiments of the disclosure.

FIG. 2 shows a diagram of an example in accordance with example embodiments of the disclosure. In another embodiment, diagram 200 illustrates an example index gradient structure 201, which may be a periodic (e.g., symmetric) index gradient structure. That is, the index gradient structure 201 may include multiple nanovoided materials that may have indices of refraction that are designed to have a particular pattern. For example, index gradient structure 201 may have a symmetric pattern of indices of refraction (e.g., the indices of refraction for the layers that are on the boundaries of the index gradient structure 201 may be higher than the index of refraction of the layers in the middle of the index gradient structure 201, or vice-versa). In one embodiment, an index gradient structure 201 having layers including three different indices of refraction is illustrated. In one embodiment, the index gradient structure 201 may include additional layers to represent more indices of refraction (e.g., four, five, six, or more different indices of refraction).

The index gradient structure 201 may include, as an example, first nanovoided materials 240a and 240b having a first index of refraction, second nanovoided materials 250a and 250b having a second index of refraction, and third nanovoided material 260 having a third index of refraction. In one embodiment, the first index of refraction may be greater than the second index of refraction, which may, in turn, be greater than the third index of refraction. In another embodiment, the first index of refraction may be similar to an index of refraction of the optical component 230. Alternatively or additionally, the first index of refraction may be similar to an index of refraction of a second optical component, not shown, which may be adjacent to the first nanovoided material 240b.

As noted, in some embodiments, the nanovoided materials (e.g., the first nanovoided materials 240a and 240b, the second nanovoided materials 250a and 250b, the third nanovoided material 260, and/or any additional nanovoided material, not shown) may include electroactive polymers and/or elastomer materials, as described above.

As noted, in some embodiments, the nanovoided materials (e.g., the first nanovoided materials 240a and 240b, the second nanovoided materials 250a and 250b, the third nanovoided material 260, and/or any additional nanovoided material, not shown) may include particles of a material having a high dielectric constant, the particles having an average diameter between approximately 10 nm and approximately 1000 nm, as described above.

In another embodiment, the optical component 230 may include any suitable optical component, including, but not limited to, a lens, a grating (e.g., a Bragg grating), a reflector, a mirror, a polarizer, a display surface, and the like. In one embodiment, the optical component 230 may include a substrate. As noted, the substrate may include transparent materials such as sapphire or glass. In one embodiment, the substrate may include silicon, silicon oxide, silicon dioxide, aluminum oxide, an alloy of silicon and germanium, and/or indium phosphide (InP), and the like. In some embodiments, the substrate may include a semiconductor material (e.g., monocrystalline silicon, germanium, silicon germanium, SiGe, and/or a III-V based material (e.g., gallium arsenide), or any combination thereof. In various embodiments, the substrate may include a polymer-based substrate, glass, or any other bendable substrate including two-dimensional materials (e.g., graphene and molybdenum disulfide), organic materials (e.g., pentacene), transparent oxides (e.g., indium gallium zinc oxide, IGZO), polycrystalline III-V materials, polycrystalline germanium, polycrystalline silicon, amorphous III-V materials, amorphous germanium, amorphous silicon, or any combination thereof. In one embodiment, the optical component 230 may have a surface having any suitable shape including, but not limited to, flat, curved, semi-curved, irregular, and the like.

In one embodiment, the optical component 230 may include a surface of an electrode (e.g., a transparent conductor, not shown), that may be in contact with the index gradient structure 201. In various embodiments, the electrode may be configured in any suitable manner, as described above.

Figure 3:
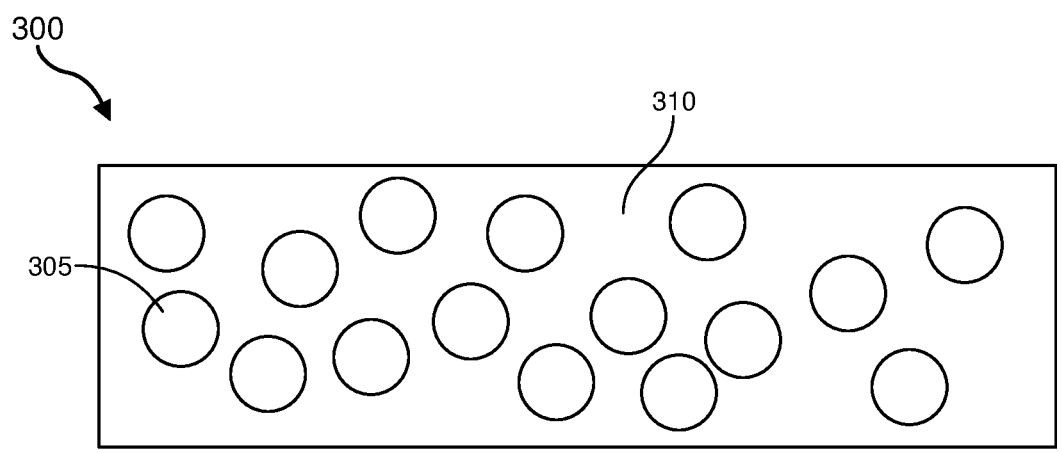
FIG. 3 shows aspects of the formation of nanovoids in a material (e.g., a polymer) that may be used in an index gradient structure, in accordance with example embodiments of the disclosure.

Diagram 300 in FIG. 3 illustrates aspects of the formation of nanovoids in a material 310 (e.g., a polymer), in accordance with example embodiments of the disclosure. In another embodiment, the material 310 may be used as one or more layers of the index gradient structures 101 and 201 shown and described in connection with FIGS. 1 and 2, above. In another embodiment, a material precursor such as a monomer may be deposited with a solvent, and the monomer and solvent may be cured leading to the separation of the solvent and the formation of the nanovoids 305 in the material 310.

In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the nanovoided material. The voids and/or nanovoids may be either closed- or open-celled, or a mixture thereof. If they are open-celled, the void size may be the minimum average diameter of the cell. In some embodiments, the nanovoided material may include a thermoset material and/or any other suitable material. In some embodiments, the material 310 defining the plurality of nanovoids may be a closed-cell nanovoided material (e.g., a closed-cell polymer material). Such a closed-cell nanovoided material may be less susceptible to absorbing contaminates in comparison to an open-cell material. Additionally, a closed-cell nanovoided material may allow for subsequent deposition of one or more liquid-based coatings.

The voids and/or nanovoids may be any suitable size and, in some embodiments, the voids may approach the scale of the thickness of the nanovoided material. For example, the voids may be between approximately 10 nm to about equal to the thickness of the nanovoided material. In some embodiments, the voids may be between approximately 10 nm and approximately 1000 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, approximately 1000 nm).

Figure 4:
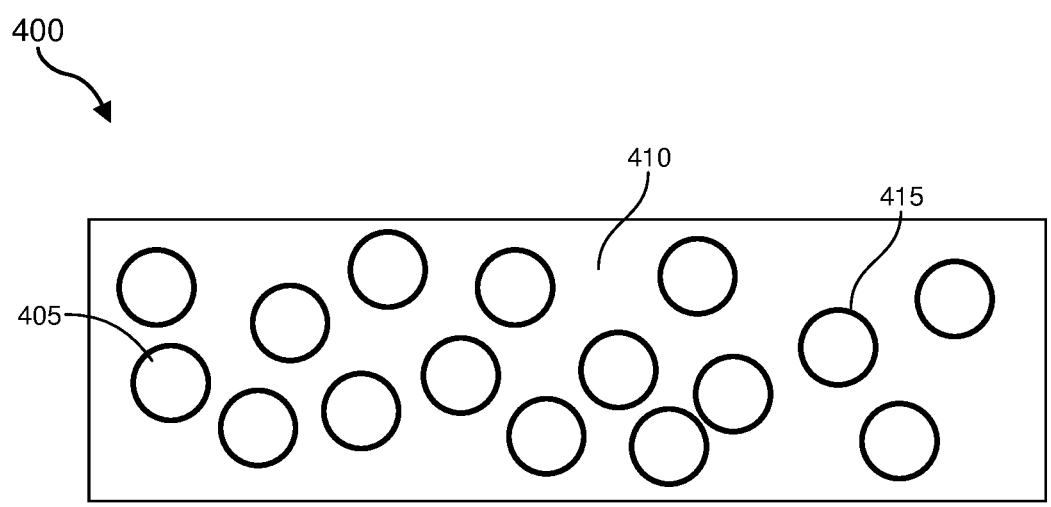
FIG. 4 shows a diagram illustrating aspects of a nanovoided material using a B-stage polymer (also referred to as B-stage epoxy or partially cured epoxy and/or polymer) for the formation of nanovoids in a material used in an index gradient structure, in accordance with example embodiments of the disclosure.

FIG. 4 shows a diagram 400 illustrating aspects of a nanovoided material 410 formed, for example, using a B-stage polymer (also referred to as B-stage epoxy or partially cured epoxy and/or polymer) for the formation of nanovoids 405, where the nanovoids may be coated, as will be described. In another embodiment, the nanovoided material 410 may be used as one or more layers of the index gradient structures 101 and 201 shown and described in connection with FIGS. 1 and 2, above. To form the nanovoids 405 in the nanovoided material 410, two monomers may be mixed. Further, a first monomer may be cured by a first source of radiation (e.g., UV light), while another monomer may be cured by a second source of radiation (e.g., heat or x-rays). Further, when the first monomer is cured to form a polymer, the polymer may exclude the second monomer along with the solvent and thereby form nanovoids 405, which may include the solvent and/or the second monomer internally.

The nanovoided material may also include a surfactant. The surfactant may provide better compatibility between the polymer and monomer, and/or between the polymer and the solvent. Alternatively, or in addition, the surfactant may reduce the surface energy of the voids, which can reduce adhesive forces when the voids are compressed.

As noted, two different sources of radiation may be used to generate the nanovoided material 410 for B-stage epoxies. In an example system, a first monomer may include a free-radical initiated monomer which may be polymerized initiated either directly through actinic radiation, or with an initiator that is activated by actinic light, while a second monomer may include a different monomer type such as an epoxy, that is unaffected by the first type of radiation (e.g., UV light). Moreover, the second monomer may be cured by a second type of energy, such as heat, or through an initiator that is activated by a second wavelength or type of actinic radiation. Accordingly, when the first monomer, second monomer, and solvent are mixed, the first monomer and second monomer may both dissolve in the solvent. The mixture may then be irradiated with a first type of radiation (e.g., UV light) such that the first monomer begins to polymerize and form a first polymer. The solvent and the second monomer regions that surround the polymerizing first monomer may be excluded from polymerizing the first monomer, leading to the formation of partially formed nanovoids. Further, excluded regions that include the solvent and second monomer may remain inside the partially formed nanovoids. When heat is further applied to the partially formed nanovoids, the solvent may start evaporating and the second monomer may coat the inside of the partially formed nanovoids, leading to the formation of the nanovoids 405 shown in FIG. 4. Accordingly, the nanovoids 405 may not move; rather the material (e.g., the second monomer and/or solvent) in the partially formed nanovoids may evaporate and the second monomer and/or the solvent may coat the interiors of the nanovoids 405. The second monomer (e.g., an epoxy) may then be polymerized to form polymer layers 415 that include a second polymer coating the interiors of the nanovoids 405 defined in the nanovoided material 410.

Moreover, because different polymers (e.g., a first polymer and a second polymer) respectively formed from the first and second monomers may have different indices of refraction and/or different mechanical properties, more sophisticated nanovoided materials may be formed using the B-stage epoxies and associated processes. For example, it may be possible to generate nanovoided materials 410 that have switchable reflectivity in an index gradient structure (e.g., an index gradient structure sandwiched by two electrodes, the electrodes including transparent conductive materials) without the need to completely compress the nanovoids 405 to generate a switching effect with high efficiency. This may be done by keeping the nanovoids 405 from fully collapsing at least in part due to different mechanical properties for the nanovoids 405, or of a polymer (e.g., the second polymer) coating the interior surfaces of the nanovoids 405, as compared with the polymer matrix (e.g., the first polymer) in which they are formed.

In some embodiments, the nanovoids (e.g., nanovoids 305 and/or 405) may contain a compressible fluid (e.g., air). In another embodiment, once the solvent separates from the curable material to form the nanovoids during the fabrication of the nanovoided material, the nanovoided material may be dried and the solvent may be replaced by a compressible fluid (e.g., air). In another embodiment, when pressure is applied to the nanovoided materials, the voids may not be fully eliminated as there may still be compressed fluid (e.g., air) in the voids. In another embodiment, the voids may be further reduced in volume by compression; for example, by forming nanovoids that have an open-cell structure. Accordingly, the compressible fluid may be able to at least partially diffuse into the compressed matrix upon compression (e.g., via mechanical or electrical means) of the nanovoided material.

Figure 5:
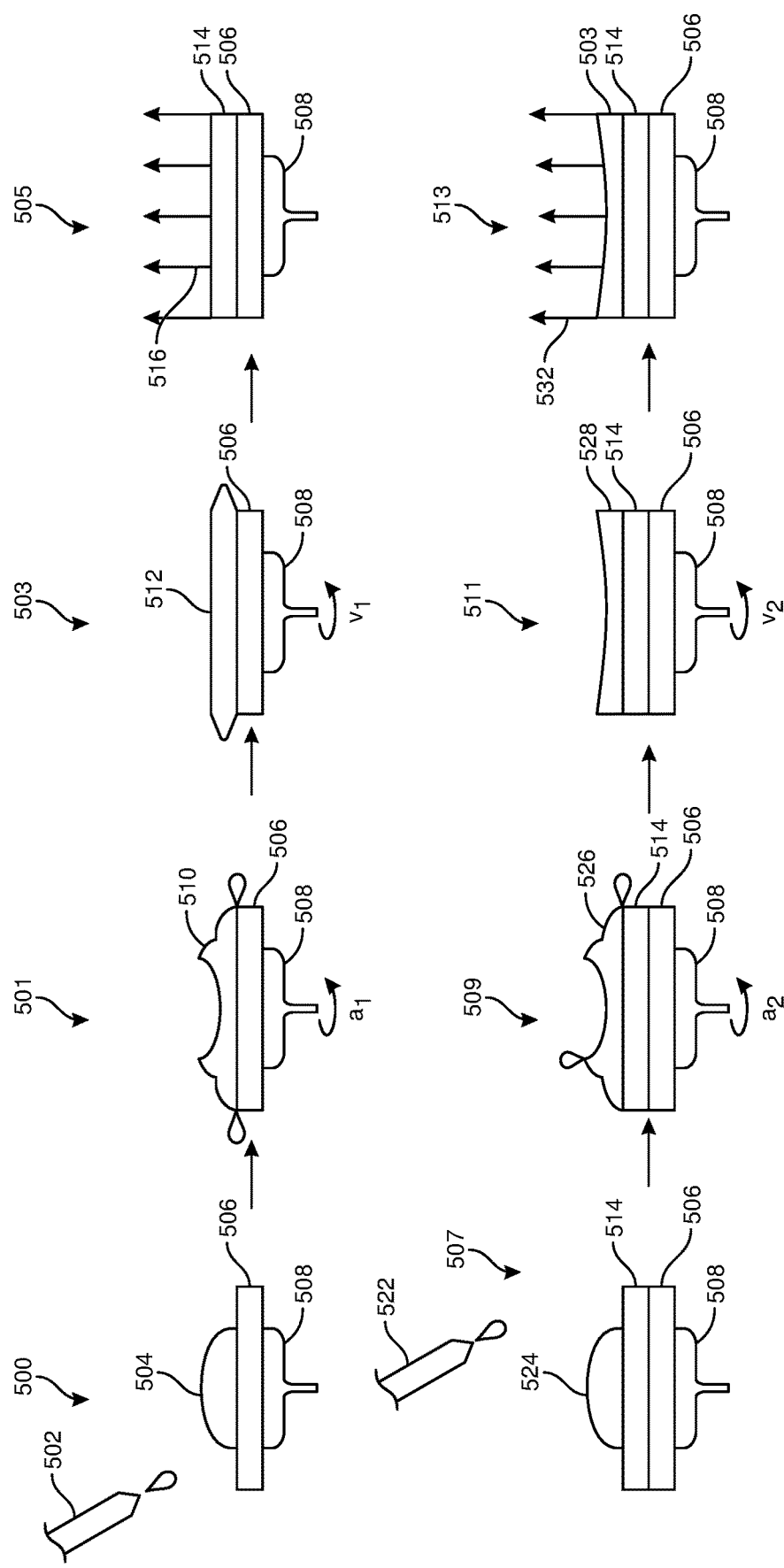
FIG. 5 shows diagrams of an example fabrication process of an index gradient structure, in accordance with example embodiments of the disclosure.

FIG. 5 shows diagrams of an example formation process of an index gradient structure, in accordance with example embodiments of the disclosure. In particular, diagram 500 shows an example spin-coating process for the fabrication of an index gradient structure. In some aspects, the spin-coating process can, for example, include multiple steps that include different concentrations of monomers to solvent, different spin-speeds, or different annealing times/temperatures). In some examples, "monomer" may refer to a monomer that forms a given polymer (i.e., as part of an optically transparent material). In some example embodiments, an index gradient structure may be generated using this spin-coating process. In another embodiment, the index gradient structure may include anywhere from two nanovoided materials to thousands of optically transparent materials (e.g., from 2 nanovoided materials to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, greater than approximately 2000 nanovoided materials.)

In particular, diagram 500 shows a substrate 506 having a rotational axis through the center of the substrate 506 and perpendicular to its surface. In some embodiments, the substrate 506 is rotated about its rotational axis at an angular velocity (which may be expressed in revolutions per minute, RPM). Moreover, the configuration and suitable equipment for performing the process described in connection with FIG. 5 may be used for spin-coating (e.g., a process whereby as the substrate 506 is rotated, centrifugal force may accelerate a fluid 504 deposited on the substrate 506 across the substrate 506 surface from the substrate's center towards the substrate's edge). The fluid 504 may include a liquid such as a photoresist, a solvent, a monomer, a dielectric, an adhesive, a conductor, combinations thereof, and/or any other suitable material. In some embodiments, the fluid 504 may include a volatile and a nonvolatile component. In addition to liquids, the fluid 504 may include a gas, a spray, a supercritical fluid, and/or the like. In some aspects, the fluid 504 may include a first concentration of monomer to solvent. Further fluids may be dispensed at later stages (e.g., fluid 522), which may have a second concentration of monomer to solvent, that is different than the first concentration. In such a way, a multilayer index gradient structure may be fabricated.

The substrate 506 may include any suitable material having a radius, R, which may be designed to match the radius of an optical element (e.g., a compound retarder, a reflective polarizer, a partial reflector, and the like) on which the resulting index gradient structure is to be coupled. In another embodiment, the radial location on the substrate 506 may be described by the variable r, wherein 0≤r≤R.

In various embodiments, as shown in diagram 500, the fluid 504 may be deposited on the substrate 506. In one embodiment, the fluid 504 may be dispensed from a fluid source 502, which may be positioned over the center of a stationary substrate 506. In other embodiments, the fluid 504 may be dispensed at another location on the substrate 506 with or without rotation.

After dispensing a suitable volume of fluid 504 (as shown and described in connection with diagram 500), the substrate 506 may be rotated at a first angular acceleration, a1, causing a similar rotation of the fluid 504 to a rotating fluid 510 (as shown in diagram 501). This may cause a portion of the rotating fluid 510 to be pushed off of the surface of the substrate 506, thereby reducing the amount of rotating fluid 510 that is in contact with the surface substrate 506. Moreover, as shown in diagram 503, the substrate 506 may be rotated at a first angular velocity, v1, that may further cause a constant velocity rotation of the rotating fluid 512, and may also cause another portion of the rotating fluid 512 to be pushed off of the surface of the substrate 506, thereby further reducing the amount of rotating fluid 512 that is in contact with the surface substrate 506. In some embodiments, the fluid may include a volatile and a nonvolatile component. In another embodiment, as centrifugal forces spin the fluid 512, the volatile component may evaporate, thereby leaving a film of the nonvolatile component.

In diagram 505, the rotating fluid 512 of diagram 503 may be brought to a stop to yield a first layer 514 over the substrate 506, and the resulting first layer 514 may have a substantially uniform thickness. In another embodiment, the fluid of the first layer 514 may be left to sit or may be heated up (e.g., via radiation, not shown); this may further allow the volatile component to evaporate 516 from the first layer 514 thereby leaving a film of the nonvolatile component. Moreover, the fluid 504 may include a cross-linking component, and the application of radiation to the first layer 514 may cause the cross-linking component to harden the first layer 514. In some aspects, the first layer 514 may be heated to a first temperature that may be different than subsequent layers (e.g., second layer 530), to be discussed further below, which may be used to generate an index gradient structure having different concentrations of nanovoids in the different layers, as shown and described in connection with FIGS. 1-2, above.

As illustrated in diagram 507, the fluid source 522 may then be repositioned from the center of the substrate 506 to a first radial location, r1. In various embodiments, another fluid 524 may be disposed using the fluid source 522, and the fluid 524 may include the same or a similar fluid as fluid 504 or a, shown and described in connection with diagram 500. Further, fluid 524 may also include a liquid such as a photoresist, a monomer, a dielectric, an adhesive, a conductor, combinations thereof, and/or any other suitable material. In some embodiments, the fluid 524 may include a volatile component and a nonvolatile component. In addition to liquids, the fluid 524 may be a gas, a spray, a supercritical fluid, and/or the like.

As shown in diagram 509, after dispensing the fluid 524 onto the first layer 514, the substrate 506 may be accelerated at a second angular acceleration, a2. The acceleration may include a step change in rotation, or it may change more smoothly. In some embodiments, the first, second, and/or subsequent angular acceleration may be unequal, but this is not necessarily so. Further, the second angular acceleration may cause a similar rotation of the fluid 524 to a rotating fluid 526, as shown in diagram 509, such that a portion of the rotating fluid 526 is pushed off of the surface of the first layer 514, thereby reducing the amount of rotating fluid 526 that is in contact with the surface of the first layer 514.

Moreover, as shown in diagram 511, the substrate 506 may be rotated at a second angular velocity, v2, that may further cause a constant velocity rotation of the rotating fluid 528, and also cause another portion of the rotating fluid 528 to be pushed off of the surface of the first layer 514, thereby further reducing the amount of rotating fluid 528 that is in contact with the surface of the first layer 514. In some embodiments, the fluid includes a volatile component and a nonvolatile component. As centrifugal forces spin up the rotating fluid 528, at least a portion of the volatile component may evaporate thereby leaving a film of the nonvolatile component.

In diagram 513, the rotating fluid 528 of diagram 511 may be brought to a stop to yield a second layer 530 over the first layer 514, where the second layer 530 may have a non-uniform thickness. In another embodiment, the fluid of the second layer 530 may be left to sit or may be heated up (e.g., via radiation, not shown); this may further allow the volatile component to evaporate 532 from the second layer 530 thereby leaving a film of the nonvolatile component. Moreover, the fluid 522 may include a cross-linking component, and the application of radiation to the second layer 530 may cause the cross-linking component to harden the second layer 530. As noted, the temperature used to heat the second layer 530 may be different than the temperature used to heat the first layer 514, which may yield different concentrations of nanovoids in the nanovoided material of the index gradient structure.

In some aspects, there may be substantially none of the second layer 530 formed inside of an annular region defined by the fluid source 522. That is, the region covered by the first layer 514 may include an area defined by 0≤r≤R, and the region covered by the second layer 530 may include an area defined by r1≤r≤R.

The process illustrated in FIG. 5 may be repeated any number of times. For example, after repositioning the fluid source (e.g., fluid source similar to fluid source 522) to a second radial location, r2, the substrate 506 may be accelerated to a third angular velocity, thereby forming a third layer (not shown) over the substrate 506. In another embodiment, the region covered by the third layer may be given by r2≤r≤R. Accordingly, by following the process illustrated in FIG. 5, a non-uniform film representing an index gradient structure may be formed over a substrate. In another embodiment, the non-uniform film may have a radial, or lateral, thickness gradient.

Further, the embodiments described above may also include processing parameters such as temperature, spin speed, monomer to solvent concentration, and/or incremental movements of the fluid source. In one embodiment, the movement of the fluid source combined with a corresponding rotation scheme may produce an AR structure that has at least one layer having a lateral thickness gradient that may be stepwise continuous. Other embodiments may include ramped parameter transitions to produce a layer that includes a linear thickness gradient. In another embodiment, the layer thickness may increase from the center of the layer to the edge of the layer.

In another embodiment, additional processing parameters during formation of one or more layers may include angular acceleration, rotation velocity, rotation duration or period, dispensing flow rate, dispensing location, distance of the fluid source from the substrate, and the like. In other embodiments, the rotation may be held constant for one or more dispensing steps. Still other embodiments may include clockwise and/or counterclockwise rotations.

For example, a first dispensing step (for example, as was shown and described in connection with diagram 500) may include accelerating a substrate clockwise to a first rotational velocity. The next step may include maintaining the first rotational velocity for a first period. It may thereafter be accelerated to a second rotational velocity. In an embodiment, the second rotational velocity may be opposite the first rotational velocity. The magnitudes of the first and second velocities may be the same or different.

The series of steps may further include one or more periods of no rotation. For example, a series of steps may include a period of clockwise rotation, a period of no rotation, and a period of either clockwise or counterclockwise rotation. In other embodiments, a clockwise rotation step may proceed substantially instantaneously to a counterclockwise rotation, with no pause between rotations. Rotational pauses or velocity changes may occur before, during, or after the dispensing of the fluid. In an embodiment, the duration of acceleration periods and constant rotation periods, for example, be up to several minutes, less than approximately 60 seconds, and/or less than approximately 10 seconds. Rotational velocities up to 3000 rpm, or greater, may be included in some embodiments.

In another embodiment, the fluids (e.g., fluid 502 and/or 522) may be applied onto the substrate by conventional coating techniques such as spin-coating or blade coating. The fluids may also be applied to the substrate by conventional printing techniques, including, but not limited to, screen printing, offset printing, roll-to-roll printing, letterpress printing, gravure printing, rotogravure printing, flexographic printing, intaglio printing, pad printing, heat-seal printing, ink-jet printing or printing by means of a stamp or printing plate.

In one embodiment, polymerization of the monomers may be achieved by exposing the polymerizable material to heat or actinic radiation, for example, after spin-coating a given layer of the index gradient structure, described above. Actinic radiation may include irradiation with light (e.g., UV light, IR light or visible light), irradiation with X-rays or gamma rays, or irradiation with high energy particles, such as ions or electrons. In another embodiment, a single UV lamp or a set of UV lamps may be used as a source for actinic radiation. When using a high lamp power the curing time may be reduced. Another possible source for actinic radiation may include a laser (e.g., a UV, IR or visible laser) or light emitting diodes (LEDs).

In various aspects, the curing time of the polymerizable material may depend on the reactivity of the fluid formulation, the thickness of the coated layer, the type of polymerization initiator and the power of the UV lamp. The curing time may be approximately less than 5 minutes, less than 3 minutes, or less than 1 minute. In another embodiment, short curing times of less than 30 seconds may be used for mass production.

In one embodiment, the polymerization process may not be limited to a single curing step. Rather it may be possible to carry out polymerization by two or more steps, in which the film is exposed to two or more lamps of the same type or two or more different lamps in sequence. The curing temperature of different curing steps may be the same or different. The lamp power and dose from different lamps may also be the same or different. In one embodiment, the polymerization may be carried out in air; however, polymerizing in an inert gas atmosphere like nitrogen or argon may also be possible.

Figure 6:
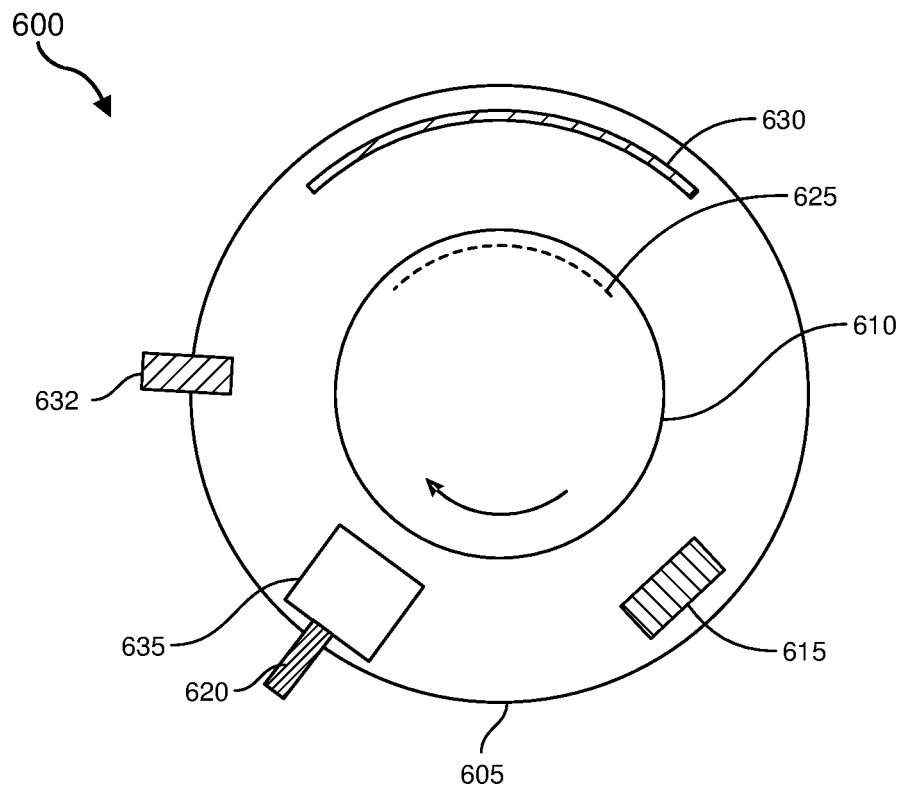
FIG. 6 shows a diagram including an apparatus that may be used for making an index gradient structure or portions of such an index gradient structure (such as one or more nanovoided material layers and/or electrodes), in accordance with example embodiments of the disclosure.

FIG. 6 shows a diagram including an apparatus that may be used for making an index gradient structure (or portions of such an index gradient structure, such as one or more nanovoided material layers, and/or electrodes), in accordance with example embodiments of the disclosure. In particular, the apparatus 600 may include a vacuum-based deposition apparatus including an enclosure (alternatively referred to as chamber) 605, a rotating drum 610, an evaporator 635, an optional condenser 630, an optional source 615, a fluid source 620, and a curing source 632. As will be elaborated on further below, the index gradient structure may be fabricated by alternating (i) depositions of solvent and a nanovoid matrix material (e.g., acrylate), (ii) heating away the solvent to create the nanovoided regions, and (iii) pumping in the nanovoid matrix material (e.g., acrylate) with no solvent. In various embodiments, a method may include (i) condensing a first vapor on a substrate and applying radiation to the substrate to form a first layer, the first vapor including mixture of a first curable material, an initiator, and a solvent, (ii) condensing a second vapor on the first layer and applying radiation to the substrate to form a second layer having a first refractive index, the second vapor including a second curable material, and (iii) removing the solvent from the first layer to form a nanovoided layer having a second refractive index that may be greater than the first refractive index.

In some embodiments, the fluid source 620 may include be a fluid that may have both a monomer (e.g., acrylic acid) and an optional crosslinking agent (e.g., trimethylolpropane triacrylate, TMPTA). As noted, in some examples, "monomer" may refer to a monomer that forms a given polymer (i.e., as part of an optically transparent material). In another embodiment, the fluid from the fluid source 620 may flow into the heat source 625, creating vapor of the monomer and crosslinker. This vapor may condense on a surface (e.g., a first transparent conductor 130a of FIG. 1) on the rotating drum 610 to form a first nanovoided material (e.g., similar to first nanovoided material 120 of FIG. 1 or a first layer of the first nanovoided materials 240a of FIG. 2). Subsequent layers (e.g., second nanovoided materials such as nanovoided material 130 or a first layer of the second nanovoided materials 250a, and so on) of an index gradient structure (e.g., index gradient structure 101 or 201) may be similarly generated. Between depositions of layers or after deposition of two or more layers, the partially or fully fabricated index gradient structure may be cured by the curing source 632. Further, after the deposition of the nanovoid stack, the index gradient structure may be coated with a material by an optional source 615. For example, the optional source may apply a metal coating and/or a metal oxide coating, or combinations thereof (e.g., serving as a second transparent conductor), as discussed above. In some embodiments, there may be more than one optional source in addition to optional source 615.

In some embodiments, the apparatus 600 may use shadow masks to control the patterns of deposited materials to form an index gradient structure. In some embodiments, the chamber 605 may be evacuated (e.g., using one or more mechanical vacuum pumps to a predetermined level such as $10^{-6}$ Torr or below). The chamber 605 may include a rigid material (e.g., steel, aluminum, brass, glass, acrylic, and the like). As noted, FIG. 6 shows an embodiment where the apparatus 600 may include a rotating drum 610. In some embodiments, the rotation of the rotating drum 610 may generate centrifugal energy and cause the deposited material to spread more uniformly over any underlying sequentially deposited materials (e.g., electrodes, optically transparent materials, and the like) that are mechanically coupled to the rotating drum 610. Alternatively, the rotating drum 610 may be configured to be fixed in position and the deposition and curing systems (e.g., monomers in the fluid source 620 and heat source 625, the optional source 615, and/or curing source 632) may be moving, or both the rotating drum 610 and the deposition and curing systems may be moving simultaneously. In some embodiments, the curing source 632 may include an energized array of filaments or other radiation source that may generate actinic energy to initiate reaction between the monomers, monomer initiators, and/or cross-linking agents. In some examples, "actinic energy" may refer to energy capable of breaking covalent bonds in a material. Examples may include electrons, electron beams, x-rays, gamma rays, ultraviolet and visible light at appropriately high energy levels, and ions. Additionally or alternatively, the heat source 625 may generate heat to initiate reaction between the monomers, monomer initiators, and/or the cross-linking agents. The monomers, monomer initiators, and/or cross-linking agents may react upon heating and/or actinic exposure to form optically transparent materials as described herein.

In some embodiments, an exhaust port (not shown) of the chamber 605 may open to release at least a portion of the vapor in chamber 605 between one or more depositions of the materials (e.g., monomers, crosslinking agents, conductive materials, etc.). In another embodiment, chamber 605 may be purged (e.g., with a gas or the application of a vacuum, or both), to remove a portion of the vapor (e.g., monomers, crosslinking agents, metal particles, and any resultant byproducts). Thereafter one or more of the previous steps may be repeated (e.g., for a nanovoided material 130 or 250a, etc.), as described above. In this way, individual layers of an index gradient structure may be maintained at high purity levels.

In some embodiments, the deposition of the materials (e.g., monomers, crosslinking agents, conductive materials, etc.) of the index gradient structure may be performed using a deposition process, such as chemical vapor deposition (CVD), to be described further below. CVD may refer to a vacuum deposition method used to produce high-quality, high-performance, solid materials. In CVD, a substrate may be exposed to one or more precursors, which may react and/or decompose on the substrate surface to produce the desired deposit (e.g., one or more transparent conductors, optically transparent materials, etc.). Frequently, volatile by-products are also produced, which may be removed by gas flow through the chamber 605.

As noted above, a flowable material (e.g., a solvent) may be combined with the curable materials (e.g., monomers) to create a flowable mixture that may be used for producing nanovoided materials including electroactive polymers (e.g., elastomers) with nanovoids. In some embodiments, the flowable material may be combined (e.g., mixed) with the curable material (e.g., monomers). In some embodiments, the curable material itself may be combined with at least one non-curable component (e.g., particles of a material having a high dielectric constant and/or initiators) to form a mixture including the curable material and the at least one non-curable component. Alternatively, the flowable material (e.g., solvent) may be introduced into the fluid source 620 to deposit (e.g., via vaporization using an evaporator 635 or, in alternative embodiments, via printing) the curable material onto the conductor. In some embodiments, the flowable material (e.g., solvent) may be deposited as a separate layer either on top of or below a curable material (e.g., a monomer), and the solvent and curable material may be allowed to diffuse into each other before being cured by the curing source 632 and/or heat source 625 to generate an optically transparent material having nanovoids. In some embodiments, after the curable material is cured, the solvent may be allowed to evaporate before another optically transparent material or another conductor is formed. In some embodiments, the evaporation of the solvent may be accelerated by the application of actinic energy by curing source 632, by application of heat to the substrate (not shown) with by heat source 625, or by reducing the pressure of the solvent vapor above the substrate using a condenser 630 (e.g., a device that condenses vapors into a liquid or solid), or a combination thereof. Isolators (not shown) may be added to the apparatus 600 to prevent, for example, the solvent vapor from interfering with the curing source 632, the condenser 630, or the optional source 615.

Figure 7:
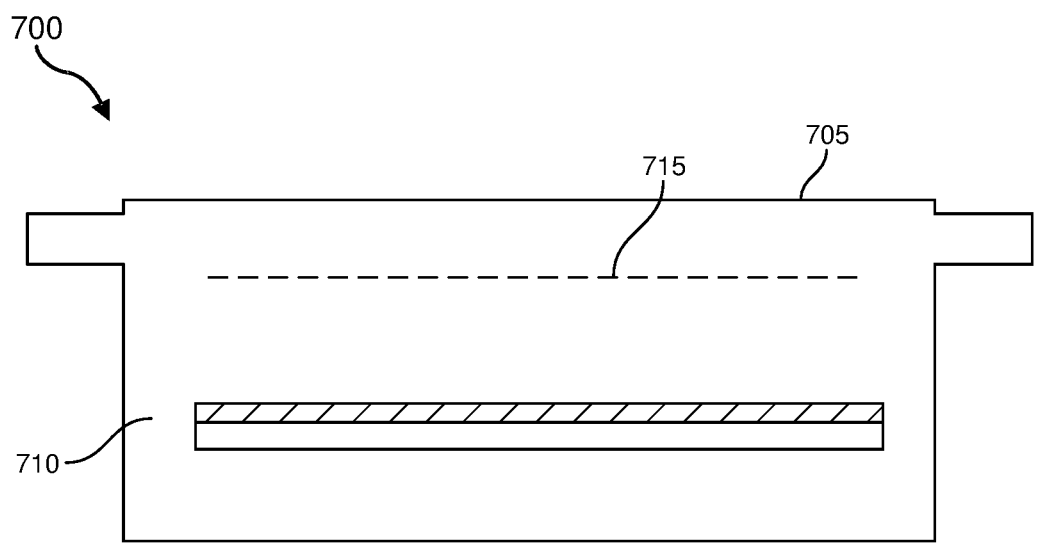
FIG. 7 shows another diagram of an example apparatus for the fabrication of an index gradient structure, in accordance with example embodiments of the disclosure.

FIG. 7 shows another diagram of an example apparatus for the fabrication of an index gradient structure, in accordance with example embodiments of the disclosure. In particular, diagram 700 shows an apparatus 705 that may perform an initiated chemical vapor deposition (CVD) process. In another embodiment, in iCVD, an electric cooler (not shown) may be used to cool a substrate, and a mixture of, for example, an acrylate and solvent vapor may flow into apparatus 705. This mixture may then pass through an array of heated elements 715 that may be located in an upper portion of the apparatus 705. In another embodiment, the heated elements 915 may be heated to an elevated temperature, such as, for example, about 200 degrees ° C., which may trigger an initiator. The substrate 710 may be concurrently cooled to a temperature below that of the heated elements. Accordingly, a mixture of solvent and monomer may condense on the surface of the substrate 710, where it may be cured. Alternatively or additionally, multiple layers of monomer and solvent-monomer mixture may be alternately deposited. The layers may be stacked through, for example, sequential deposition, and the solvent may be removed (e.g., through evaporation by heating) to generate a nanovoided structure. In another embodiment, relatively precise control of the temperature of the substrate and the multilayer deposited structure may be used to generate a high-quality switchable device. For example, active cooling may be used. In at least one embodiment, Henry's law may be used to infer that minor fluctuations of the low-pressure environment (e.g., the pressure of the chamber) will likely not substantially affect the vapor pressure of the solvent and may therefore not negatively impact the quality, structure, and/or uniformity of the nanovoided materials.

In some embodiments, the apparatus 705 may apply an atmospheric pressure CVD (APCVD) coating formation technique (e.g., CVD at atmospheric pressure). In another embodiment, the apparatus 705 may apply a low-pressure CVD (LPCVD) process (e.g., CVD at sub-atmospheric pressures). In some embodiments, LPCVD may make use of reduced pressures that may reduce unwanted gas-phase reactions and improve the deposited nanovoided material's uniformity across the substrate. In one embodiment, the apparatus 705 may apply an ultrahigh vacuum CVD (UHVCVD) process (e.g., CVD at very low pressure, typically below approximately $10^{-6}$ Pa (equivalently, approximately $10^{-8}$ torr)).

In some embodiments, the apparatus 705 may apply an aerosol-assisted CVD (AACVD) process (e.g., a CVD in which the precursors are transported to the index gradient structure) by means of a liquid/gas aerosol, which may be generated ultrasonically. In some embodiments, AACVD may be used with non-volatile precursors.

In some embodiments, the apparatus 705 may apply a direct liquid injection CVD (DLICVD) process (e.g., a CVD in which the precursors are in liquid form, for example, a liquid or solid dissolved in a solvent). Liquid solutions may be injected in the apparatus 705 towards one or more injectors. The precursor vapors may then be transported to the index gradient structure as in CVD. DLICVD may be used on liquid or solid precursors, and high growth rates for the deposited materials may be reached using this technique.

In some embodiments, the apparatus 705 may apply a hot wall CVD process (e.g., CVD in which the chamber of the apparatus 705 is heated by an external power source and the index gradient structure is heated by radiation from the heated wall of the chamber). In another embodiment, the apparatus 705 may apply a cold wall CVD process (e.g., a CVD in which only the materials forming the index gradient structure is directly heated, for example, by induction, while the walls of the chamber are maintained at room temperature).

In some embodiments, the apparatus 705 may apply a microwave plasma-assisted CVD (MPCVD) process, where microwaves are used to enhance chemical reaction rates of the precursors for forming the index gradient structure. In another embodiment, the apparatus 705 may apply a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the resulting index gradient structure or in depositing certain materials (e.g., organic materials and/or some polymers).

In some embodiments, the apparatus 705 may apply a remote plasma-enhanced CVD (RPECVD) process. In some embodiments, RPECVD may be similar to PECVD except that the materials for forming the index gradient structure may not be directly in the plasma discharge region. In some embodiments, the removal of the materials for forming the index gradient structure from the plasma region may allow for the reduction of processing temperatures down to room temperature.

In some embodiments, the apparatus 705 may apply an atomic-layer CVD (ALCVD) process. In some embodiments, ALCVD may deposit successive layers of different substances to produce an index gradient structure that includes layered, crystalline film coatings of the index gradient structure.

In some embodiments, the apparatus 705 may apply a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (e.g., a monolayer) to several micrometers in thickness) and nanomaterials, which may be used in forming the index gradient structure.

In some embodiments, the apparatus 705 may apply a hot filament CVD (HFCVD) process, which may also be referred to as catalytic CVD (cat-CVD) or initiated CVD (iCVD), as noted above. In some embodiments, this process may use a hot filament to chemically decompose the source gases to form the materials of the index gradient structure. Moreover, the filament temperature and temperature of portions of the materials for forming index gradient structure may be independently controlled, allowing colder temperatures for better adsorption rates at the index gradient structure, and higher temperatures necessary for decomposition of precursors to free radicals at the filament.

In some embodiments, the apparatus 705 may apply a hybrid physical-chemical vapor deposition (HPCVD) process. HPCVD may involve both chemical decomposition of precursor gas and vaporization of a solid source to form the materials of the index gradient structure.

In some embodiments, the apparatus 705 may apply metalorganic chemical vapor deposition (MOCVD) process (e.g., a CVD that uses metalorganic precursors) to form materials of the index gradient structure.

In some embodiments, the apparatus 705 may apply a rapid thermal CVD (RTCVD) process. This CVD process may use heating lamps or other methods to rapidly heat the materials forming index gradient structure. Heating only materials deposited on a substrate on which the index gradient structure is formed rather than undeposited precursors or chamber walls may reduce unwanted gas-phase reactions that may lead to particle formation in the index gradient structure.

In some embodiments, the apparatus 705 may apply a photo-initiated CVD (PICVD) process. This process may use UV light to stimulate chemical reactions in the precursor materials used to make the materials for the index gradient structure. Under certain conditions, PICVD may be operated at or near atmospheric pressure.

In some embodiment, while various CVD processes are generally described above the various materials described herein (e.g., the curable materials, the non-curable material, the conductive materials, and/or any additional materials and layers may be disposed (e.g., on a substrate) in any suitable manner. As noted, a substrate may generally refer to any material (e.g., a layer) on which another layer or element is formed. In another embodiment, various materials for forming the electroactive device may be printed (e.g., via inkjet printing, silk screen printing, etc.). In some aspects, inkjet printing may refer to a type of computer printing that operates by propelling droplets of material onto a substrate (e.g., a flexible or inflexible substrate). In another embodiment, silkscreen printing may refer to a printing technique whereby a mesh is used to transfer a material (e.g., curable material and/or non-curable material) onto a substrate (e.g., a flexible or inflexible substrate), except in areas made impermeable to the material by a blocking stencil. A blade or squeegee may be moved across the screen to fill the open mesh apertures with the material, and a reverse stroke may then cause the screen to touch the substrate momentarily along a line of contact. This may cause the material to wet the substrate and be pulled out of the mesh apertures as the screen springs back after the blade has passed. In one embodiment, the materials may be vaporized (e.g., via thermal evaporation, CVD, PVD, and/or the like), as described above. In at least one embodiment, materials for forming the device may be deposited (e.g., on a substrate) using a co-flow process and/or a roll-to-roll process. In some embodiments, monomers (or oligomers, prepolymers, and/or other pre-cursor materials) for forming electroactive polymer materials of the AR structure may optionally be mixed with a solvent and the solvent may be removed from the electroactive polymer during and/or following curing to form nanovoids within the index gradient structure.

Figure 8:
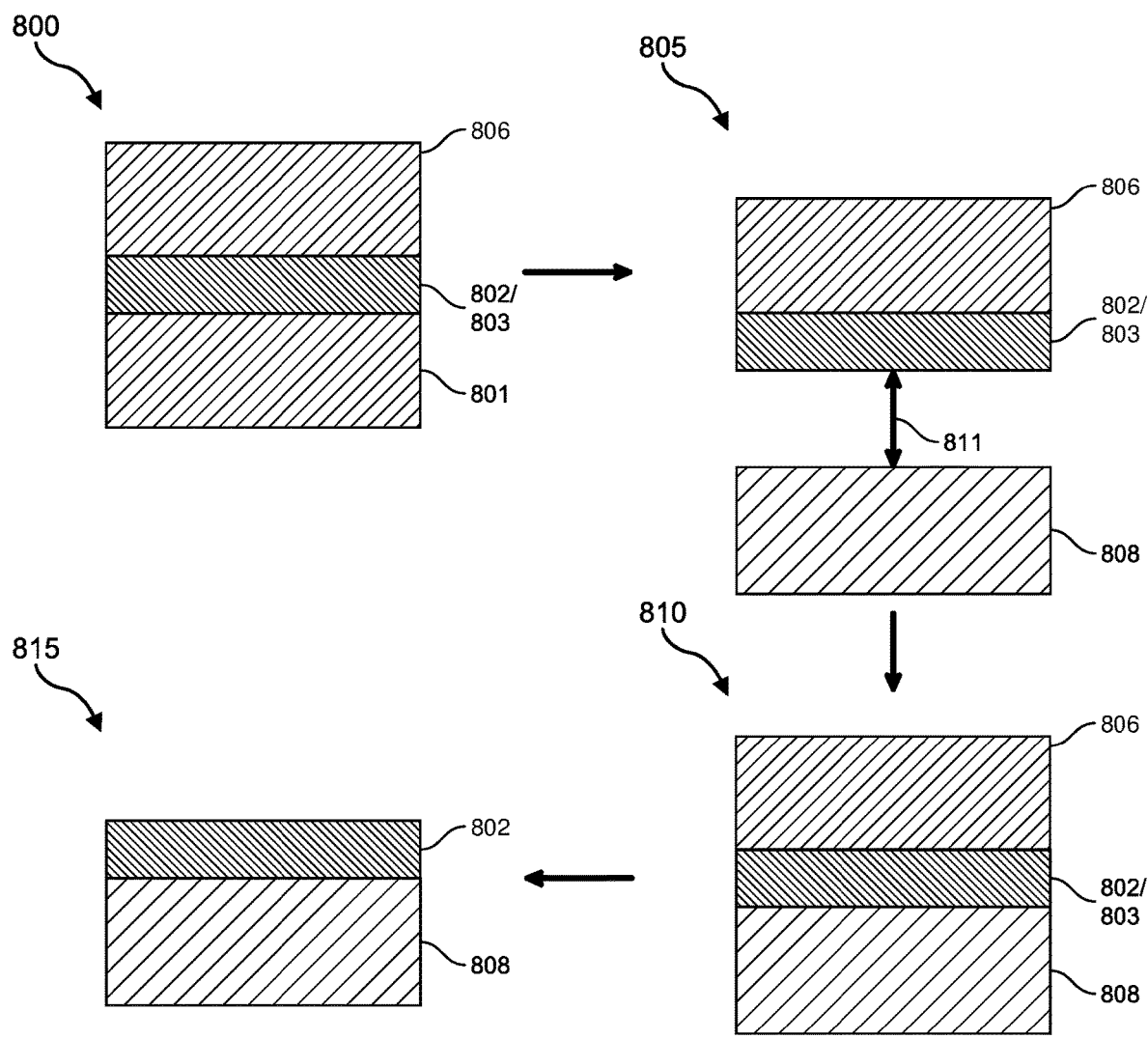
FIG. 8 shows a diagram of an example method of using an index gradient structure, in accordance with example embodiments of the disclosure.

FIG. 8 shows a diagram illustrating an example method of using an index gradient structure, in accordance with example embodiments of the disclosure. In another embodiment, the protected index gradient structure 800 may include a first removable material 801 (e.g., a peelable material), an index gradient structure 802 that may include a buffer material 803, and a second removable material 806. In particular, the first removal material 801 and the second removable material 806 may serve to protect the index gradient structure 802 from external elements (dust, debris, etc.) and may allow the index gradient structure 802 to be coupled to a surface of an optical component.

In another embodiment, the first removable material 801 may include viscoelastic polymers with their rheology tuned to the desired bonding and de-bonding characteristics needed. In another embodiment, the first removable material 801 may include acrylate polymer, rubber (either natural rubber or synthetic thermoplastic elastomer, silicone rubber), and the like. In another embodiment, these materials may be blended with a tackifier to produce tack (e.g., a term that may refer to the grabbing power of the first removable material 801) at room temperature, may be somewhat deformable, may have low surface energy, and may be moisture resistant. Further, the materials may have a low cross-linking density, low viscosity ($\eta$<10,000 cP), and/or may have broad molecular weight distribution to enable deformation of the adhesive material to the rough surface of an underlying substrate under various temperatures and peel conditions.

In one embodiment, the protected index gradient structure 800 may optionally include a buffer material 803. In one embodiment, the buffer material 803 may provide a planarization or passivation to the surface of the optical element that the index gradient structure 802 is ultimately laminated on. In an embodiment, the buffer material 803 may include any suitable material. For example, the buffer material 803 may include a polyolefin-based resin such as polypropylene, polymethylpentene, and a cyclic olefin-based polymer (e.g. norbornene-based resins, triacetyl cellulose, polyethylene terephthalate, polycarbonate resin, polyethylene naphthalate, polyurethane, polyether ketone, polysulfone, polyether sulfone, polyester, polystyrene-based resin, or acrylic-based resin). In one embodiment, the buffer material 803 may be thicker than the index gradient structure 802. In another embodiment, if the buffer material 803 is thin, the laminate including the buffer material 803 and the index gradient structure 802 may be curled due to cure shrinkage of the resin constituting the index gradient structure 802.

In another embodiment, the interface between the first removal material 801 and the buffer material 803 index gradient structure 802 may include an adhesive layer (not shown). In one embodiment, the adhesive layer may be made of any material. To the face of the adhesive layer opposite to the face where the buffer material 803 is provided, a separator film (e.g. polyethylene terephthalate (PET), not shown) for protection of the adhesive layer may be adhered.

In various embodiment, any suitable adhesive may be used. For example, the adhesive may be a self-assembled monolayer, a pressure sensitive adhesive (PSA), a standard reactive adhesive, or the like. Self-assembled monolayer adhesives may use a silane coupling agent including an alkoxysilane and a reactive functional group. The silane coupling unit may covalently react with a glass substrate and the reactive functional group may react with the index gradient structure. Examples of silane coupling agents may include, for example, 3-glycidoxypropyltri methoxysila ne, (2-aminoethyl)aminopropyltriethoxysilane, aminopropyltrimethoxysilane, aminopropyltriethoxysilane, (2-aminoethyl)aminopropylmethyldimethoxysilane, methacyryloxypropylmethyltrimethoxysilane, ethacyryloxypropyltrimethoxysilane, glycidoxypropyltrimethoxysilane, mercaptopropyl trimethoxysilane, vinyltriacetoxysilane, chloropropyltrimethoxysilane, vinyltrimethoxysilane, octadecyldimethyl-[3-(trimethoxysilyl)-propyl]ammonium chloride, mercaptopropyl-methyldimethoxysilane, isocyanatopropyltriethoxysilane, (3-acryloxpropyl)trimethoxy-silane, and the like.

PSAs may be polymeric materials applied between two layers for forming a bond with the desired cohesive strength upon application of a light pressure. A primary mode of bonding for a pressure sensitive adhesive may not be chemical or mechanical, but rather may be a polar attraction of an adhesive to a given material. Pressure sensitive adhesives may be designed with a balance between flow and resistance to flow. The bond may form because the adhesive may be soft enough to flow or wet the substrate. The bond may have strength because the adhesive may be hard enough to resist flow when stress is applied to the bond. Once the adhesive and the substrate are in proximity of each other, additional molecular interactions occur, such as, for example, Van der Waals' forces, capillary forces and the like, or combinations thereof, which may provide a significant contribution to the strength of the bond.

When peeled from a surface (e.g., when removed from the buffer material 803), the adhesive may demonstrate a clean peel, cohesive splitting, delamination and the like, or combinations thereof. The rate of bond formation may be determined by the conditions under which the adhesive contacts a surface and is controlled by the surface energy of the adhesive, the surface energy of the substrate, and the viscosity of the adhesive. Cohesion is the property of a pressure sensitive adhesive that allows it to resist shear stress. Cohesion may further be a measure of an adhesive's internal bond strength. Good cohesion may be necessary for a clean peel. In an embodiment, the adhesive layer may include a material that have a first index of refraction that is substantially similar to at least one of an index of refraction of an optical component (e.g., a retarder, a polarizer, a mirror, a lens, and the like) or an index of refraction of the index-gradient AR structure.

In one embodiment, the protected structure 800 may include a second removable material 806 (e.g., a peelable material). FIG. 8 shows a diagram of an example method of using an index gradient structure 802, in accordance with example embodiments of the disclosure. In another embodiment, the protected structure 800 may include a second removable material 806 (e.g., a peelable material). In another embodiment, the second removable material 806 may include viscoelastic polymers with their rheology tuned to the desired bonding and de-bonding characteristics needed. In another embodiment, the second removable material 806 may include acrylate polymer, rubber (either natural rubber or synthetic thermoplastic elastomer, silicone rubber), and the like. In another embodiment, these materials may be blended with a tackifier to produce tack (e.g., a term that may refer to the grabbing power of the second removable material 806) at room temperature, may be somewhat deformable, may have low surface energy, and may be moisture resistant. Further, the materials may have a low cross-linking density, low viscosity ($\eta$<10,000 cP), and may have broad molecular weight distribution to enable deformation of the adhesive material to the rough surface of an underlying substrate under various temperatures and peel conditions.

In various aspects, FIG. 8 illustrates aspects of the attachment of the index gradient structure 802 to a substrate 808. In another embodiment, the first removable material 801 may be removed from the protected structure 800, to reveal a surface of the buffer material 803 (or if the buffer material 803 is not included in the protected structure 810, a surface of the index gradient structure 802). Thereafter, the surface of the buffer material 803 may be coupled 811 (e.g., laminated, pressure laminated, etc.) onto a surface of the substrate 808, thereby yielding a semi-protected structure 810, as shown in FIG. 8.

In particular, the semi-protected structure 810 may still have a second removable material 806 that may protect the index gradient structure 802. The second removable material 806 may be subsequently removed (e.g., peeled away) to yield a structure 815 that includes the exposed surface of the index gradient structure 802, as shown in FIG. 8.

Figure 9:
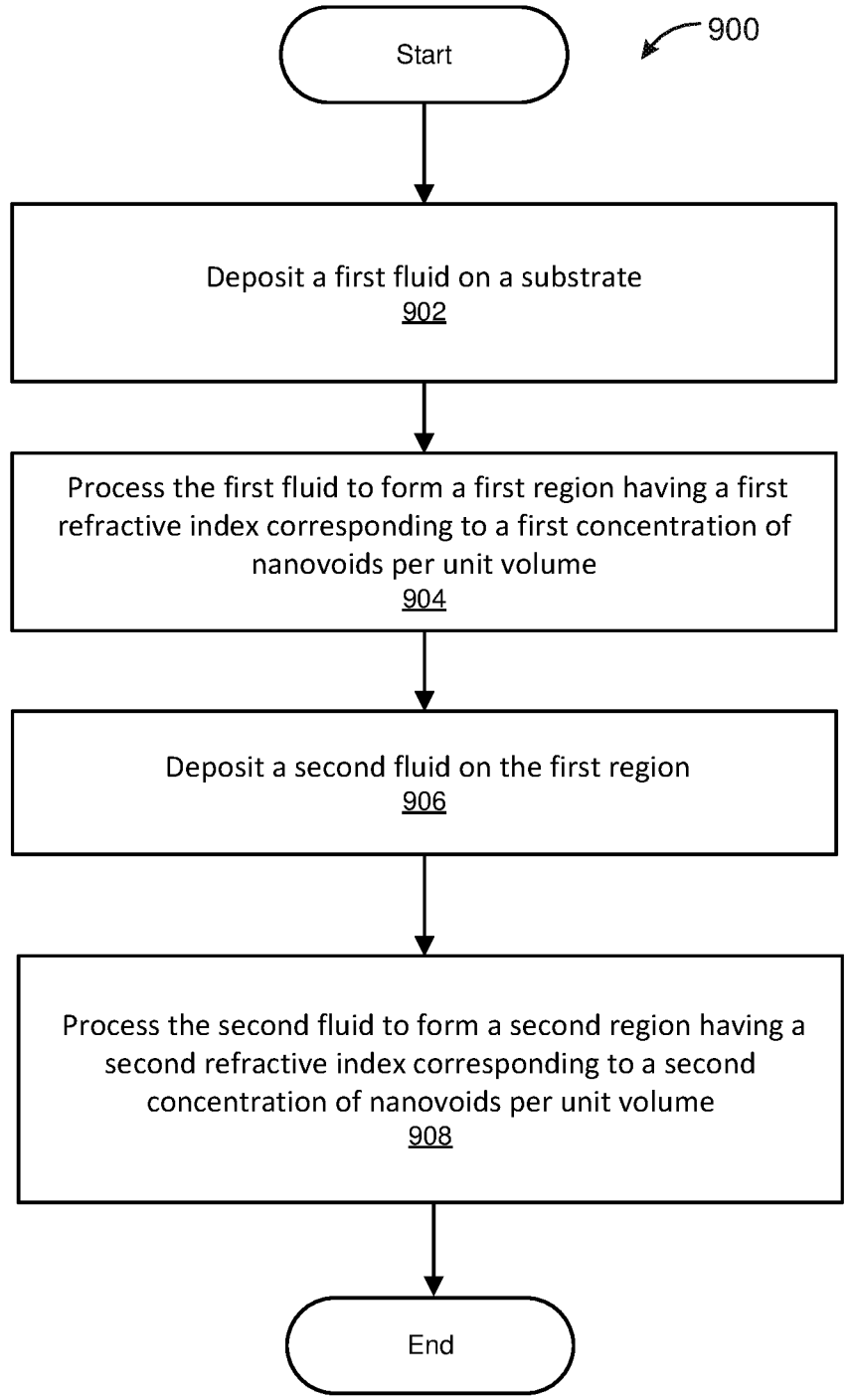
FIG. 9 shows a diagram of an example process flow for the fabrication of an index gradient structure, in accordance with example embodiments of the disclosure.

FIG. 9 shows a diagram of an example method 900 for the fabrication of an index gradient structure, in accordance with example embodiments of the disclosure.

At step 902, a first fluid may be deposited on a substrate. In another embodiment, the substrate may be optically transparent, and made of, for example, polymer, glass, or ceramics. In one embodiment, fluid may include a liquid or a vapor that is composed of a solvent and a monomer. As will be described below, the deposition of fluid (e.g., the first fluid, but also the second and/or subsequent fluids) may be performed using spin-coating technique or a thermal evaporation technique, combinations thereof, and the like.

At step 904, the first fluid may be processed to form a first region having a first refractive index corresponding to a first concentration of nanovoids per unit volume. In one embodiment, the first region (e.g., a first layer of the index gradient AR structure) may have a first refractive index of approximately 1.0, which may be less than the refractive index of subsequent regions (e.g., a second layer of the index gradient structure).

In one embodiment, as noted, the first fluid may be deposited using a spin-coating process (e.g., a non-uniform spin-coating process), which may include dispensing the first fluid onto a surface of the substrate at a first radial position while spinning the substrate at a first angular velocity. In another embodiment, the non-uniform spin-coating process may include dispensing the first fluid having a first concentration of monomers onto a surface of the substrate (and later, dispensing a second fluid having a second concentration of monomers onto the first fluid). In some aspects, the dispensed fluid may be processed at a first temperature for a first duration to generate the first region.

In another embodiment, as noted, the first fluid may be deposited using a thermal evaporation process. The thermal evaporation process may include depositing the first fluid including a first vapor onto a surface of the substrate to generate the first region, the first vapor including a first concentration of a monomer. In some aspects, the deposited vapor may be processed at a first temperature for a first duration to generate the first region.

At step 906, a second fluid may be deposited on the first region. In another embodiment, the dispensing of the fluid onto the surface of the first region may be performed at a second radial position while spinning the substrate at a second angular velocity, where the second angular velocity may be different than the first angular velocity. Alternatively, in an aspect, a second fluid including a thermally evaporated vapor may be deposited onto the first region to generate the second region, the second vapor including a second concentration of the monomer, where the first concentration and the second concentration are different.

At step 908, the second fluid may be processed to form a second region having a second refractive index corresponding to a second concentration of nanovoids per unit volume. In another embodiment, in the case of a spin-coated process, the second fluid may be processed at a second temperature for a second duration to generate the second region. A thermal evaporation process may similarly, include processing the second region at a second temperature for a second duration. In another embodiment, the ratio of the monomer and the solvent may change during the thermal evaporation deposition process (e.g., during the deposition of a given material, in order to set up an index gradient).

In some aspects, another method of generating a nanovoided polymer for use in connection with an index gradient structure as described variously herein may additionally or alternatively include co-depositing (i) a monomer or mixture of monomers, (ii) a surfactant, and (iii) a nonsolvent material associated with the monomer(s) which is compatible with the surfactant. In various examples, the monomer(s) may include, but not be limited to, ethyl acrylate, butyl acrylate, octyl acylate, ethyethoxy ethyl acrylate, 2-chloroethyl vinyl ether, chloromethyl acrylate, methacrylic acid, allyl glycidyl ether, or N-methylol acrylamide. Other curing agents such as polyamines, higher fatty acids or their esters, or sulfur may be used as the monomer(s). In some aspects, the surfactant may be ionic or non-ionic (for example Span 80, available from Sigma-Aldrich Company). In another embodiment, the non-solvent material may include organic or inorganic non-solvent materials. For instance, the non-solvent material may include water or a hydrocarbon or may include a highly polar organic compound such as ethylene glycol. As noted, the monomer or monomers, non-solvent, and surfactant may be co-deposited; alternatively, the monomer or monomers, non-solvent, and surfactant may be deposited sequentially. In one embodiment, a substrate temperature may be controlled to generate and control one or more properties of the resulting emulsion generated by co-depositing or sequentially depositing the monomer or monomers, non-solvent, and surfactant. Further, the substrate may be treated to prevent destabilization of the emulsion. For example, a metal substrate such as an aluminum layer may be coated with a thin polymer layer made by depositing a monomer followed by curing the monomer.

Figure 10:
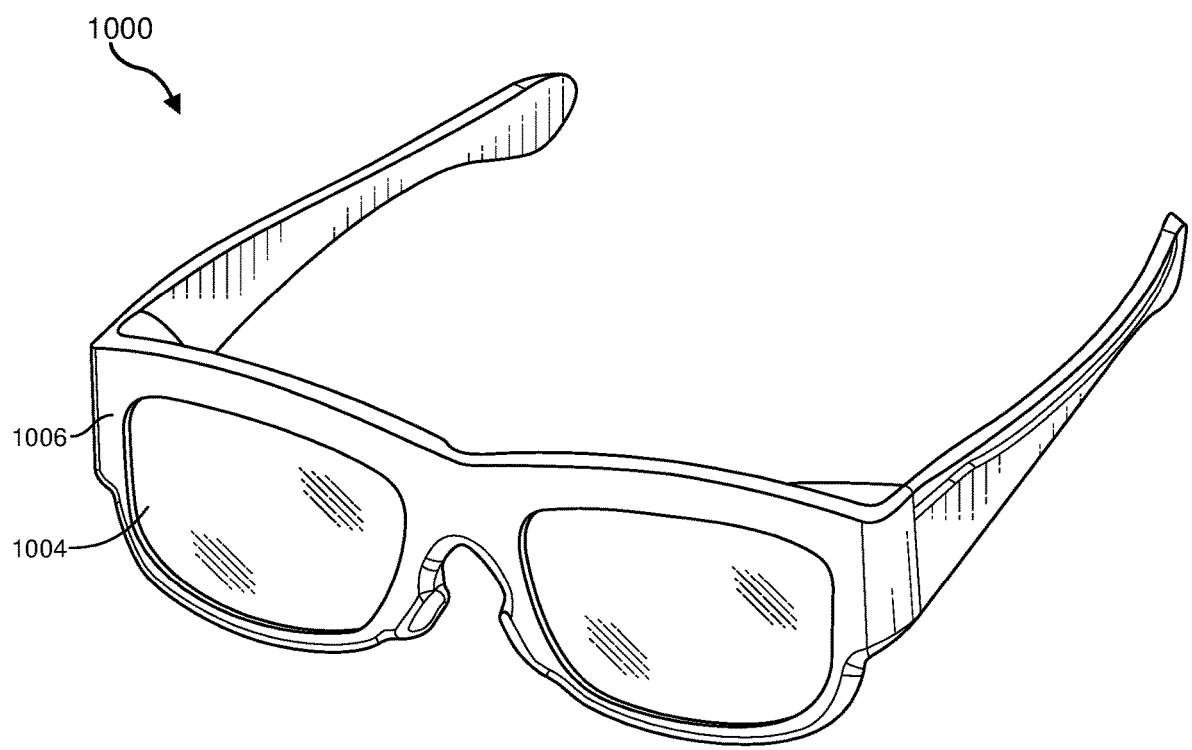
FIG. 10 shows a diagram of a head-mounted display (HMD) using an index gradient structure, in accordance with example embodiments of the disclosure.

FIG. 10 shows a diagram of a head-mounted display (HMD) 1000, in accordance with example embodiments of the disclosure. As noted, the nanovoided materials may be used in the fabrication AR structures, mirrors for augmented reality (AR) systems that may include partially transparent displays that mix digital images with the real world.

In some embodiments, the HMD 1000 may include an NED, which may include a display device 1004. The display device 1004 may present media to a user. Examples of media presented by the display device 1004 include one or more images, a series of images (e.g., a video), audio, or some combination thereof. In some embodiments, audio is presented via an external device (e.g., speakers and/or headphones) that receives audio information from the display device 1004, a console (not shown), or both, and presents audio data based on the audio information. The display device 1004 may be generally configured to operate as an AR NED, such that a user may see media projected by the display device 1004 and see the real-world environment through the display device 1004. However, in some embodiments, the display device 1004 may be modified to also operate as a virtual reality (VR) NED, a mixed reality (MR) NED, or some combination thereof. Accordingly, in some embodiments, the display device 1004 may augment views of a physical, real-world environment with computer-generated elements (e.g., images, video, sound, etc.).

As noted, the nanovoided layers may be used in the fabrication of an index gradient structure. In some embodiments, the nanovoided layers may be used to fabricate mirrors for AR systems that may include partially transparent displays that mix digital images with the real world. Light rays may reflect off a mirror to redirect into a user's eye. In other words, the eye may receive redirected rays from the digital display (e.g., from a projector or light-emitting diodes). Further, the optical device that combines the generated digital image with the real-world light may be referred to as a combiner. The combiner may operate like a partial mirror that redirects display light and selectively lets light in through from the real world. In such applications, a high reflectivity for the redirected light along with a high transmission for ambient light may be desired. In another embodiment, the combiner may be fabricated using the index gradient structure. In some embodiments, the disclosed index gradient structure may have higher contrast, lower polarization sensitivity, and higher switching times than comparable devices without nanovoided materials.

The display device 1004 shown in FIG. 10 may include a support or frame 1006 that secures the display device 1004 in place on the head of a user, in embodiments in which the display device 1004 includes separate left and right displays. In some embodiments, the frame 1006 may be a frame of eye-wear glasses. The display device 1004 may include structures (e.g., waveguides) with devices (e.g., Bragg reflectors, holographic Bragg reflectors, etc.) as described herein. In some embodiments, the devices may be manufactured by the processes described herein.

Embodiments of the instant disclosure may include or be implemented in conjunction with an artificial reality system. Artificial reality is a form of reality that has been adjusted in some manner before presentation to a user, which, as noted, may include, e.g., a VR, an AR, a MR, a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a HMD connected to a host computer system, a standalone HMD, a mobile device or computing system, or any other hardware platform capable of providing artificial reality content to one or more viewers.

The process parameters and sequence of the steps described and/or illustrated herein are given by way of example only and may be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An anti-reflective structure comprising:
 a polymer matrix material defining a plurality of nanovoids that includes closed-cell nanovoids disposed within each of a first region and a second region of the polymer matrix material, wherein:
  the first region has a first refractive index corresponding to a first concentration of nanovoids per unit volume;
  the second region has a second refractive index corresponding to a second concentration of nanovoids per unit volume;
  the first region and the second region are overlapped in a thickness direction of the anti-reflective structure; and the closed-cell nanovoids in at least one of the first region or the second region are defined by a second polymer material coating interior regions of the polymer matrix.

2. The anti-reflective structure of claim 1, wherein the first region has a first refractive index of approximately 1.15 and the second region has a second refractive index greater than approximately 1.3.

3. The anti-reflective structure of claim 1, wherein the anti-reflective structure comprises oxide particles within the polymer matrix material.

4. The anti-reflective structure of claim 1, wherein the anti-reflective structure has an optical thickness of about one half of a central wavelength of a spectral region for which a reflectance is to be reduced.

5. The anti-reflective structure of claim 1, wherein the anti-reflective structure is fabricated using a non-uniform spin-coating process.

6. The anti-reflective structure of claim 5, wherein the non-uniform spin-coating process comprises:
dispensing a fluid onto a surface of a substrate at a first radial position while spinning the substrate at a first angular velocity; and
dispensing the fluid onto the surface of the substrate at a second radial position while spinning the substrate at a second angular velocity.

7. The anti-reflective structure of claim 5, wherein the non-uniform spin-coating process comprises:
dispensing a first fluid having a first concentration of monomers onto a surface of a substrate; and
dispensing a second fluid having a second concentration of monomers onto the first fluid.

8. The anti-reflective structure of claim 5, wherein the non-uniform spin-coating process comprises:
dispensing a first fluid onto a surface of a substrate;
processing the dispensed fluid at a first temperature for a first duration to generate the first region;
dispensing a second fluid onto the first region; and
processing the second fluid at a second temperature for a second duration to generate the second region.

9. The anti-reflective structure of claim 5, wherein the non-uniform spin-coating process comprises:
dispensing a first fluid comprising a first ratio of monomer to solvent onto a surface of a substrate;
processing the first fluid with actinic light to generate the first region;
dispensing a second fluid containing a second ratio of monomer to solvent; and
processing the second fluid with actinic light to generate a second region.

10. The anti-reflective structure of claim 1, wherein the anti-reflective coating is fabricated using a thermal evaporation process.

11. The anti-reflective structure of claim 10, wherein thermal evaporation process comprises:
depositing a first vapor onto a surface of a substrate to generate the first region, the first vapor comprising a first concentration of a monomer; and
depositing a second vapor onto the first region to generate the second region, the second vapor comprising a second concentration of the monomer,
wherein the first concentration and the second concentration are different.

12. The anti-reflective structure of claim 10, wherein the thermal evaporation process comprises:
depositing a vapor onto a surface of a substrate to generate the first region;
processing the first region at a first temperature for a first duration;
depositing the vapor onto the first region to generate a second region; and
processing the second region at a second temperature for a second duration.

13. The anti-reflective structure of claim 10, wherein the thermal evaporation process comprises:
depositing a first vapor comprising a solvent and a monomer onto a surface of a substrate to generate the first region, the first vapor having a first ratio of the solvent to the monomer; and
depositing a second vapor comprising a solvent and a monomer onto a surface of a substrate to generate the first region, the first vapor having a second ratio of the solvent to the monomer, where the first ratio and the second ratio are different ratios.

14. The antireflective structure of claim 1, wherein the anti-reflective structure is fabricated using initiated chemical vapor deposition (iCVD) process using a vapor comprising a monomer and a solvent.

15. The antireflective structure of claim 14, wherein a ratio of the monomer to the solvent changes during the iCVD process.

16. An optical system comprising:
an optical element; and
an anti-reflective structure disposed at least partially on a surface of the optical element, the anti-reflective structure comprising a polymer matrix material defining a plurality of nanovoids that includes closed-cell nanovoids disposed within each of a first region and a second region of the polymer matrix material, wherein:
the first region has a first refractive index corresponding to a first concentration of nanovoids per unit volume;
the second region has a second refractive index corresponding to a second concentration of nanovoids per unit volume, the first region and the second region being overlapped in a thickness direction of the anti-reflective structure; and
the closed-cell nanovoids in at least one of the first region or the second region are defined by a second polymer material coating interior regions of the polymer matrix.

17. The optical system of claim 16, wherein the optical system includes at least one of an augmented reality functionality, a virtual reality functionality, or a mixed reality functionality.

18. The optical system of claim 16, wherein the first region has a first refractive index of approximately 1.15 and the second region has a second refractive index greater than approximately 1.3.

19. The optical system of claim 16, wherein the anti-reflective structure has an optical thickness of about one half of a central wavelength of a spectral region for which a reflectance is to be reduced.

\* \* \* \* \*